United States Patent
Abdo

(10) Patent No.: US 10,629,978 B2
(45) Date of Patent: Apr. 21, 2020

(54) MULTI-PATH INTERFEROMETRIC JOSEPHSON ISOLATOR BASED ON NONDEGENERATE THREE-WAVE MIXING JOSEPHSON DEVICES

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 74 days.

(21) Appl. No.: 15/797,929

(22) Filed: Oct. 30, 2017

(65) Prior Publication Data

US 2019/0131683 A1 May 2, 2019

(51) Int. Cl.
*H01P 5/18* (2006.01)
*H01L 39/24* (2006.01)
(Continued)

(52) U.S. Cl.
CPC .............. *H01P 5/18* (2013.01); *B82Y 10/00* (2013.01); *H01L 39/025* (2013.01);
(Continued)

(58) Field of Classification Search
CPC ....... H01P 5/18; H01L 39/025; H01L 39/2493
See application file for complete search history.

(56) References Cited

U.S. PATENT DOCUMENTS 4,162,323 A 7/1979 Kahan
4,163,232 A 7/1979 Fitzsimmons
(Continued)

FOREIGN PATENT DOCUMENTS

EP 0372951 A2 6/1990
EP 0372951 B1 6/1990
(Continued)

OTHER PUBLICATIONS

PCT, International Searching Authority, PCT/IB 2017/057987, dated Aug. 22, 2018.
(Continued)

*Primary Examiner* — Dean O Takaoka
*Assistant Examiner* — Alan Wong
(74) *Attorney, Agent, or Firm* — Garg Law Firm, PLLC; Rakesh Garg; Keivan Razavi

(57) ABSTRACT

A microwave isolator device includes two nondegenerate microwave mixer devices, each mixer configured to receive a microwave input of an input frequency via a first port and to generate an idler signal of an idler frequency at a second port. The second ports of both mixers are coupled together. A first input/output (I/O) port is coupled to the first ports of the two mixers, and a second I/O port is also coupled to the first ports of the two mixers. A microwave signal (signal) communicated between the first I/O port and the second I/O port is transmitted while propagating in a first direction between the first I/O port to the second I/O port through the first mixer and the second mixer and to be blocked while propagating in a second direction between the second I/O port to the first I/O through the first mixer and the second mixer.

25 Claims, 23 Drawing Sheets

US 10,629,978 B2
Page 2

(51) Int. Cl.
*H01L 39/02* (2006.01)
*H01P 11/00* (2006.01)
*H03D 7/00* (2006.01)
*B82Y 10/00* (2011.01)
*G06N 10/00* (2019.01)
*H03D 9/06* (2006.01)

(52) U.S. Cl.
CPC ........ *H01L 39/2493* (2013.01); *H01P 11/007* (2013.01); *H03D 7/005* (2013.01); *G06N 10/00* (2019.01); *H03D 2009/0691* (2013.01)

(56) References Cited

U.S. PATENT DOCUMENTS

| | | |
|---|---|---|
| 5,411,937 A | 5/1995 | Wendt |
| 5,552,735 A | 9/1996 | Kang |
| 5,872,731 A | 2/1999 | Chan et al. |
| 6,374,093 B1 | 4/2002 | Pesola et al. |
| 6,486,756 B2 | 11/2002 | Tarutani et al. |
| 7,468,630 B2 | 12/2008 | Inamdar et al. |
| 7,557,600 B2 | 7/2009 | Chong et al. |
| 8,098,099 B2 | 1/2012 | Kao et al. |
| 8,611,974 B2 | 12/2013 | Maibaum et al. |
| 9,130,508 B1 | 9/2015 | Kang et al. |
| 9,455,707 B2 | 9/2016 | Herr |
| 9,641,138 B2 | 5/2017 | Zhu |
| 9,735,776 B1 | 8/2017 | Abdo et al. |
| 9,768,771 B2 | 9/2017 | Naaman |
| 9,787,278 B1 | 10/2017 | Abdo |
| 9,928,948 B2 | 3/2018 | Naaman et al. |
| 10,062,829 B1 * | 8/2018 | Abdo .................... H01L 39/025 |
| 10,211,798 B2 | 2/2019 | Abdo |
| 10,230,038 B2 * | 3/2019 | Abdo .................... H03D 7/005 |
| 2004/0012407 A1 | 1/2004 | Amin |
| 2013/0214979 A1 | 8/2013 | McMillin et al. |
| 2015/0119252 A1 | 4/2015 | Ladizinsky |
| 2016/0308502 A1 * | 10/2016 | Abdo .................... H03F 7/04 |
| 2016/0380636 A1 | 12/2016 | Abdo |
| 2017/0170812 A1 | 2/2017 | Abdo |
| 2017/0093381 A1 | 3/2017 | Abdo |
| 2017/0104695 A1 | 4/2017 | Naaman |
| 2018/0091244 A1 | 3/2018 | Abdo |
| 2018/0137428 A1 | 5/2018 | Abdo |
| 2019/0131683 A1 | 5/2019 | Abdo |
| 2019/0171974 A1 | 6/2019 | Abdo |
| 2019/0213496 A1 | 7/2019 | Abdo |

FOREIGN PATENT DOCUMENTS

| | | |
|---|---|---|
| JP | 2009194646 A | 2/2008 |
| JP | 2009194646 A | 8/2009 |
| KR | 100604396 B1 | 7/2006 |
| WO | 2003034542 A1 | 10/2001 |
| WO | 03034542 A1 | 10/2002 |
| WO | 2015057389 A1 | 4/2015 |
| WO | 20150057839 A1 | 4/2015 |
| WO | 2016127021 A1 | 6/2015 |
| WO | 2016094045 A1 | 6/2016 |
| WO | 2016127021 A1 | 8/2016 |

OTHER PUBLICATIONS

PCT, International Searching Authority, PCT/E P2018/050247, dated Aug. 6, 2018.
PCT, International Searching Authority, PCT/E P2018/050244, dated Aug. 24, 2018.
PCT, International Searching Authority, PCT/E P2018/050245, dated Sep. 7, 2018.
PCT, International Searching Authority, PCT/EP2018/050251, dated Aug. 29, 2018.
PCT, International Searching Authority, PCT/EP2018/050246, dated Aug. 17, 2018.
PCT, Written Opinion of the International Searching Authority (Separate Sheet), PCT/EP2018/050253, ISA/237, EPO—dated Apr. 2005.
Selective Switching of Frequency Multiplexed Microwave Signals Using Cascading Multi-Path Interferometric Josephson Switches With Nonoverlapping Bandwidths.
Frattini NE et al: '3-wave mixing Josephson dipole element', Applied Physics Letters, A I P Publishing LLC, US, vol. 110, No. 22, May 31, 2017 (May 31, 2017), XP012219271, ISSN: 0003-6951, DOI: 10.1063/1.4984142, retrieved on May 31, 2017.
Baleegh Abdo et al: "Multi -Path 1,4,12, Interferometric Josephson Directional 13 ,16 Amplifier for Qubit Readout", arxiv.org, Cornell University Library, 281 Olin Li Brary Cornell University Ithaca, NY 14853, Oct. 8 2817 (2817-18-88), XP888826758, A p. 2, paragraph 4—p. 5, paragraph 1-, 2,3, figures 1-3.
Baleegh Abdo et al: "Directional Amplification with a Josephson Circuit", Physical Review X, vol. 3, No. 3, Jul. 1, 2013 (Jul. 1, 2013), XP055493386, DOI: 10.1103/PhysRevX.3.031001 A p. 2, left-hand column, paragraph 4 p. 3, left-hand column, paragraph 2; figure 1, p. 3, right-hand column, paragraph 3 p. 4, left-hand column, paragraph 1; figure 2.
Westig MP et al: "Josephson parametric reflection amplifier with integrated directionality", arxiv.org, Cornell University Library, 201 Olin Library Cornell University Ithaca, NY 14853, Jun. 28, 2017 (Jun. 28, 2017), XP080773209, p. 1, right-hand column, paragraph 2; figure 1.
Bergeal N et al: "Analog information processing at the quantum limit with a Josephson ring modulator", arxiv.org, Cornell University Library, 201 Olin Library Cornell University Ithaca, NY 14853, May 22, 2008 (May 22, 2008), XP080419198, DOI: 10.1038/NPHYS1516, p. 5-p. 15.
Naaman et al: "On-chip Josephson 1-6, junction microwave switch", 11-17, Appli Ed Physics Letters, A I P Publishing LLC, US, vol. 108, No. 11, Mar. 14, 2016 (Mar. 14, 2016), pp. 112601-1, XP012205944, ISSN: 0003-6951, 001: 10.1063/1.4943602.
Frattini et al; 3- wave mixing Josephson dipole element, Applied Physics letters 110, 222603, 2017.
Naaman et al; On-Chip Josephson junction microwave switch, Applied Physics letters 108, 112601, 2016.
USPTO, Notice of Allowance—U.S. Appl. No. 15/829,138, dated Apr. 24, 2019.
Erickson et al, Theory of Multiwave Mixing within, arXiv:1612.00365v2 [physics.class-ph] Feb. 15, 2017.
Lecocq et al, Nonreciprocal microwave signal, arXiv:1612.01438v1 [quant-ph] Dec. 5, 2016.
Macklin et al, a near-quantum-, Downloaded from www.sciencemag.org on Sep. 3, 2015.
Metelmann et al, Nonreciprocal Photon Transmission, Physical Review X 5, 021025 (2015).
Bergeal et al, Analog Information Processing, arXiv:0805.3452v2 [cond-met.mes-hall] Oct. 22, 2009.
Baleegh Abdo, Directional Amplification with Josephson Circuit, Physical Review X 3,031001 (2013).
Baleegh Abdo, Multi-path Interferometric Josephson Directional Amplifier for Qubit Readout, arXiv:1710.02521v1 [physics-ins-det] Oct. 8, 2017.
Westing et al, Josephson parametric reflection amplifier with integrated directionality, arXiv:1706.093001v1 [cond-mat.supr-con] Jun. 28, 2017.
USPTO, Non Final Office Action, U.S. Appl. No. 15/829,054, dated Sep. 17, 2018.
USPTO, Notice of Allowance—U.S. Appl. No. 15/829,054, dated Jan. 10, 2019.
USPTO, Non Final Office Action, U.S. Appl. No. 15/797,929, dated Apr. 4, 2019.
USPTO, Notice of allowance—U.S. Appl. No. 15/829,099, dated Apr. 16, 2019.
Abdo et al., "Josephson Directional Amplifier for Quantum Measurement of Superconducting Circuits", 10.11 03/PhysRevLett.112.167701, Physical Review Letters, Apr. 25, 2014 (Year: 2014).
USPTO, Notice of allowance—U.S. Appl. No. 15/829,127, dated Sep. 12, 2018.

(56) References Cited

OTHER PUBLICATIONS

USPTO, Notice of allowance—U.S. Appl. No. 15/829,215, dated Apr. 16, 2019.
Patent Cooperation Treaty, European Patent, P201703600BPCT01 # EP2018/050245, Jan. 5, 2018.
Patent Cooperation Treaty, China Patent, P201703191PCT01 #IB2017/057987, Dec. 15, 2017.
Patent Cooperation Treaty, European Patent, P201703600PCT01 # EP2018/050247, Jan. 5, 2018.
Patent Cooperation Treaty, European Patent, P201703600APCT01 # EP2018/050244, Jan. 5, 2018.
Patent Cooperation Treaty, European Patent, P201703600CPCT01 # EP2018/050251, Jan. 5, 2018.
Patent Cooperation Treaty, European Patent, P201703600DPCT01 # EP2018/050246, Jan. 5, 2018.
Patent Cooperation Treaty, European Patent, P201703600EPCT01 # EP2018/050253, Jan. 5, 2018.

* cited by examiner

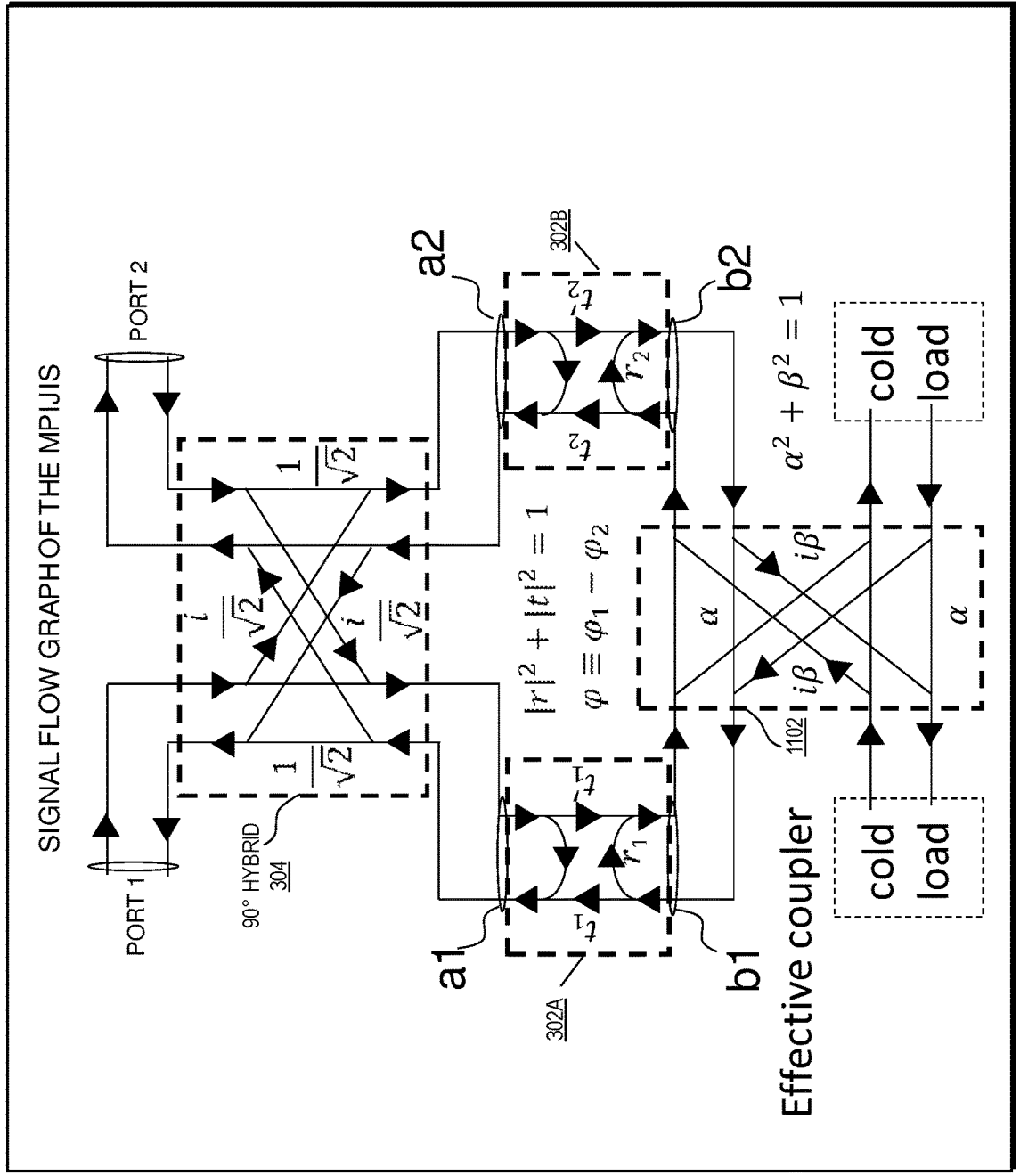

SIMPLIFIED SIGNAL FLOW GRAPH OF THE MPIJIS

*FIGURE 14*

Special case of nominally identical mixers operated at the same working point

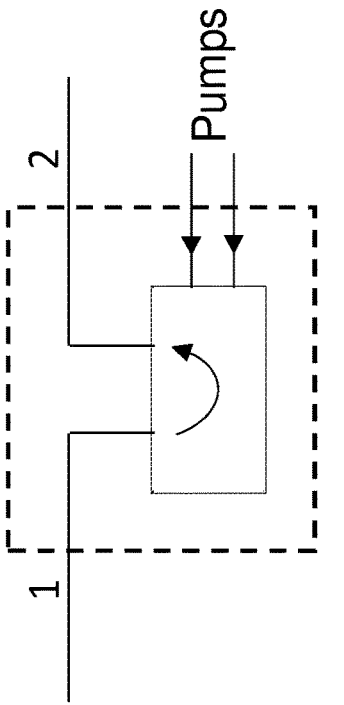

$r_1 = r_2 = r$ $|t_1| = |t_1'| = |t_2| = |t_2'| = t$ $|\alpha| = \alpha'$ $\varphi \equiv \varphi_1 - \varphi_2$ $S_{a_1 a_1} = S_{a_2 a_2} = r \dfrac{1 - \alpha'^2 e^{2i\varphi_d}}{1 - r^2 \alpha'^2 e^{2i\varphi_d}}$ $S_{a_1 a_2} = -\dfrac{t^2 \alpha' e^{i(\varphi_d - \varphi)}}{1 - r^2 \alpha'^2 e^{2i\varphi_d}}$ $S_{a_2 a_1} = -\dfrac{t^2 \alpha' e^{i(\varphi_d + \varphi)}}{1 - r^2 \alpha'^2 e^{2i\varphi_d}}$

⇨

$S_{11} = S_{22} = -\dfrac{it^2 \alpha' e^{i\varphi_d}}{1 - r^2 \alpha'^2 e^{2i\varphi_d}} \cos(\varphi)$ $S_{21} = \dfrac{i}{1 - r^2 \alpha'^2 e^{2i\varphi_d}} \left( r(1 - \alpha'^2 e^{2i\varphi_d}) - t^2 \alpha' e^{i\varphi_d} \sin(\varphi) \right)$ $S_{12} = \dfrac{i}{1 - r^2 \alpha'^2 e^{2i\varphi_d}} \left( r(1 - \alpha'^2 e^{2i\varphi_d}) + t^2 \alpha' e^{i\varphi_d} \sin(\varphi) \right)$

*FIGURE 16*

Example of an isolator working point II

Operating at the 50/50 beam splitter point $r_1 = r_2 = r = 1/\sqrt{2}$ $|t_1| = |t_1'| = |t_2| = |t_2'| = |t| = 1/\sqrt{2}$ $|\alpha| = 1/\sqrt{2}$ $\varphi_d = \pi k, k = 0, \pm 1, \pm 2, \ldots$ For $\varphi_d = 0$ and on resonance $\Downarrow$ $S_{a1a1} = \dfrac{\sqrt{2}}{3} \qquad S_{a2a2} = \dfrac{\sqrt{2}}{3}$ $S_{a1a2} = -\dfrac{\sqrt{2}}{3} e^{-i\varphi} \qquad S_{a2a1} = -\dfrac{\sqrt{2}}{3} e^{i\varphi}$ Where $\quad \varphi \equiv \varphi_1 - \varphi_2$ $\Downarrow$ $S_{11} = -i\dfrac{\sqrt{2}}{3}\cos\varphi \qquad S_{22} = -i\dfrac{\sqrt{2}}{3}\cos\varphi$ $S_{12} = i\dfrac{\sqrt{2}}{3}(1+\sin\varphi) \qquad S_{21} = i\dfrac{\sqrt{2}}{3}(1-\sin\varphi)$

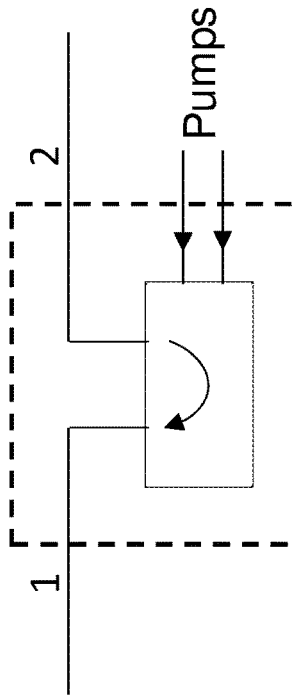

For $\varphi = \pi/2$ $\Downarrow$ $S_{11} = 0 \qquad S_{22} = 0$ $S_{12} = i\dfrac{2\sqrt{2}}{3} \qquad S_{21} = 0$ $\Downarrow$ $|S_{12}|^2 = 0.8889 \quad \Longrightarrow \quad |S_{12}|\,(\mathrm{dB}) = -0.51\ \mathrm{dB}$ $[S] = \begin{pmatrix} 0 & i\dfrac{2\sqrt{2}}{3} \\ 0 & 0 \end{pmatrix}$

*FIGURE 17*

Example of an isolator working point III

Operating at the 50/50 beam splitter point $r_1 = r_2 = r = 1/\sqrt{2}$ $|t_1| = |t'_1| = |t_2| = |t'_2| = |t| = 1/\sqrt{2}$ $|\alpha| = 1/\sqrt{2}$ $\varphi_d = \pi k, k = 0, \pm 1, \pm 2, \ldots$ For $\varphi_d = \pi$ and on resonance $\Longrightarrow$ $S_{a1a1} = \dfrac{\sqrt{2}}{3}$   $S_{a2a2} = \dfrac{\sqrt{2}}{3}$ $S_{a1a2} = \dfrac{\sqrt{2}}{3} e^{-i\varphi}$   $S_{a2a1} = \dfrac{\sqrt{2}}{3} e^{i\varphi}$ Where  $\varphi \equiv \varphi_1 - \varphi_2$ $\Longrightarrow$ $S_{11} = i\dfrac{\sqrt{2}}{3}\cos\varphi$   $S_{22} = i\dfrac{\sqrt{2}}{3}\cos\varphi$ $S_{12} = i\dfrac{\sqrt{2}}{3}(1 - \sin\varphi)$   $S_{21} = i\dfrac{\sqrt{2}}{3}(1 + \sin\varphi)$

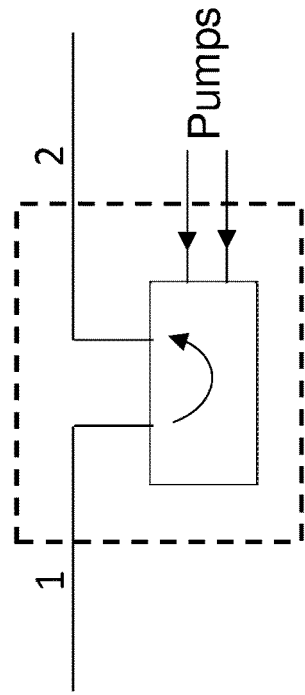

For $\varphi = \pi/2$ $\Longrightarrow$ $S_{11} = 0$   $S_{22} = 0$ $S_{12} = 0$   $S_{21} = i\dfrac{2\sqrt{2}}{3}$ $\Longrightarrow$ $|S_{21}|^2 = 0.8889$   $|S_{21}|(\text{dB}) = -0.51\text{ dB}$ $\Longrightarrow$ $[S] = \begin{pmatrix} 0 & 0 \\ i\dfrac{2\sqrt{2}}{3} & 0 \end{pmatrix}$

US 10,629,978 B2

MULTI-PATH INTERFEROMETRIC JOSEPHSON ISOLATOR BASED ON NONDEGENERATE THREE-WAVE MIXING JOSEPHSON DEVICES

TECHNICAL FIELD

The present invention relates generally to a device, a fabrication method, and fabrication system for a microwave light isolator usable with superconducting qubits in quantum computing. More particularly, the present invention relates to a device, method, and system for a multi-path interferometric Josephson isolator based on nondegenerate three-wave mixing Josephson devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the 0> and 1> states of the qubit. This operational constraint on any circuit that operates with quantum information necessitates special considerations in fabricating semiconductor and superconducting structures that are used in such circuits.

A microwave isolator is a device that allows microwave light waves to pass through it without significant amplitude attenuation in one direction, and prohibits or significantly attenuates the microwave light waves when attempting to pass through it in the opposite direction. A reference herein to an "isolator" is a reference to a microwave isolator.

In other words, the isolator operates as a microwave light gate, and the response of the device is dependent on the direction in which the microwave light is propagating through the device.

Isolators are used in quantum computing for guiding the microwave signals into and out of the quantum processor in a specified flow direction. The illustrative embodiments recognize that presently used commercial cryogenic isolators suffer from serious problems that greatly limit their applicability and usability in quantum computing. For example, commercially available cryogenic Isolators are large in size, heavy in weight, difficult to thermalize, use ferrites which are difficult to fabricate/integrate on chip, and incorporate magnets which can have negative effects on superconducting circuits. To give some examples, the size of a presently available cryogenic isolator is 8.5 centimeters (cm)×3.1 cm×1.7 cm=45 $cm^3$, and the isolator weighs 229.5 grams (g). The copper bracket that is used to thermalize the isolator weighs 183.1 g. The size of a presently available cryogenic circulator is 4.5 cm×3.5 cm×1.8 cm, and weighs 41.2 g.

A standard one input-one output line setup, which connects one qubit resonator and one quantum-limited Josephson parametric amplifier working in reflection (such as the Josephson parametric converter (JPC)), uses two circulators, and three isolators (two following the Josephson parametric amplifier in order to protect the qubit from noise coming back down the output chain). This setup accounts for a volume of at least 191.1 $cm^3$ and weight of at least 1.5 kg (just from the circulators and isolators). The volume calculation does not take into account the copper brackets that are used for thermalization.

These are large sizes and weights as compared to nanometer-scale Josephson junction in a qubit. Clearly, the presently available isolators and circulators are not conducive to fabrication on semiconductor chips. The magnetic flux due to the incorporated magnets is too strong compared to the femtoTesla ($10^{-15}$ T) level of magnetic flux that is sometimes used to flux bias certain superconducting quantum systems such as flux-tunable qubits.

The illustrative embodiments recognize that a new isolator design is needed that is more conducive to quantum computing applications.

SUMMARY

The illustrative embodiments provide a superconducting device, and a method and system of fabrication therefor. A superconducting device of an embodiment includes a first nondegenerate microwave mixer device (first mixer) having a first port and a second port, the first mixer configured to receive a microwave input of an input frequency via a first port, and further configured to generate an idler signal of an idler frequency at a second port. The embodiment includes a second nondegenerate microwave mixer device (second mixer) having a different first port and a different second port, the second mixer configured to receive the microwave input of the input frequency via a different first port, and to generate the idler signal of the idler frequency at a different second port. the second port being coupled to the different second port. The embodiment includes a first input/output (I/O) port coupled to the first port and the different first port. The embodiment includes a second I/O port coupled to the first port and the different first port, wherein a microwave signal (signal) communicated between the first I/O port and the second I/O port is transmitted while propagating in a first direction between the first I/O port to the second I/O port through the first mixer and the second mixer and to be blocked while propagating in a second direction between the second I/O port to the first I/O through the first mixer and the second mixer. Thus, the embodiment provides a microwave isolator device that is significantly compact as compared to the prior-art isolators, and can be fabricated with other quantum devices in a superconducting quantum circuit.

An embodiment further includes a first microwave pump injecting a first microwave drive into the first mixer at a pump frequency and a first pump phase, wherein the idler frequency of the idler signal at the second port is dependent upon the pump frequency and the input frequency. The embodiment includes a second microwave pump injecting a second microwave drive into the second mixer at the pump frequency and a second pump phase, wherein the idler frequency of the idler signal at the different second port is dependent upon the pump frequency and the input frequency. Thus, the embodiment provides a specific configuration to accomplish microwave drive injection in the mixers.

In another embodiment, the first microwave pump is configured to cause the first mixer to operate at a 50:50 beamsplitting working point, and wherein the second microwave pump is configured to cause the second mixer to operate at the 50:50 beamsplitting working point. Thus, the embodiment provides a specific mode in which the mixers are operated.

In another embodiment, changing a difference between the first pump phase and the second pump phase causes the signal to be transmitted while propagating in the second direction and blocked while propagating in a first direction. Thus, the embodiment provides a manner of controlling a direction of the signal propagation through the isolator.

Another embodiment further includes a four-port microwave hybrid device (pump hybrid). The embodiment includes a microwave pump coupled to the pump hybrid such that a first output port of the pump hybrid injects a first microwave drive into the first mixer at a pump frequency and a first pump phase and a second output port of the pump hybrid injects a second microwave drive into the second mixer at the pump frequency and a second pump phase, wherein the pump hybrid fixes a relative phase between the first microwave drive and the second microwave drive to ±90 degrees. Thus, the embodiment provides a different configuration for injecting microwave drive into the mixers.

In another embodiment, the second port and the different second port are coupled via a transmission line, the transmission line having a negligible energy loss. Thus, the embodiment provides a specific manner of coupling the two mixers.

In another embodiment, the second port and the different second port are coupled together using a coupling component, wherein the coupling component introduces an attenuation of a signal that is propagated between the first mixer and the second mixer. Thus, the embodiment provides a different manner of coupling the two mixers.

In another embodiment, the second port of the first mixer comprises a first feedline and a second feedline, the different second port of the second mixer comprises a different first feedline and a different second feedline, the second feedline and the different second feedline are coupled via a transmission line, the transmission line having a negligible energy loss, the first feedline is coupled to a 50 Ohm termination, the different first feedline is coupled to a different 50 Ohm termination. Thus, the embodiment provides a different manner of coupling the two mixers.

In another embodiment, the first and second I/O ports are part of a ninety-degree hybrid coupler, and a function of the first port and the different first port are configured to be equivalent in the first mixer and the second mixer. Thus, the embodiment provides a specific configuration of the hybrid and the mixers such the that the resulting device operates as an isolator.

In another embodiment, the first mixer and the second mixer are each a nondegenerate three-wave mixer. Thus, the embodiment provides a specific type of mixer devices that can be used to form the isolator.

In another embodiment, the first mixer and the second mixer are each a Josephson parametric converter (JPC), and the first mixer and the second mixer are nominally identical. Thus, the embodiment provides a specific type of mixer devices that can be used to form the isolator.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 11 depicts a generalized signal flow graph of an MPIJIS in accordance with an illustrative embodiment;

FIG. 14 depicts device equations for the special case of nominally identical mixers operated at the same working point;

FIG. 16 depicts the device equations when the mixers operated at the 50:50 beam splitter point but the transmitting direction is changed; and FIG. 17 depicts the device equations when the mixers operated at the 50:50 beam splitter point but the phase acquired by the internal-mode signals propagating between the two mixers is different.

DETAILED DESCRIPTION

Figure 1:
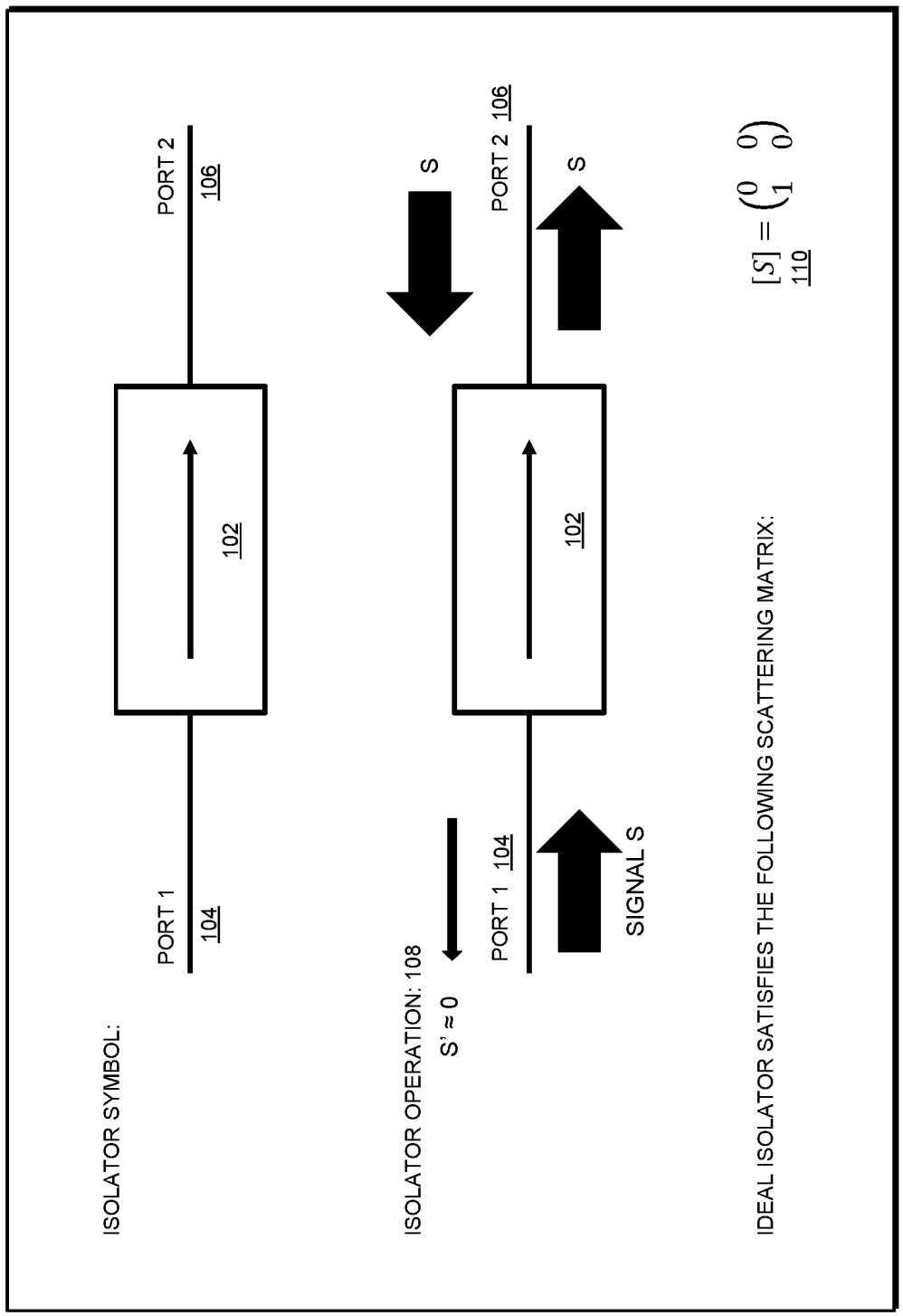
FIG. 1 depicts a block diagram of a conceptual isolator function achieved by an MPIJIS in accordance with an illustrative embodiment.

The illustrative embodiments used to describe the invention generally address and solve the above-described needs for a multi-path interferometric Josephson isolator based on nondegenerate three-wave mixing Josephson devices. A multi-path interferometric Josephson isolator based on nondegenerate three-wave mixing Josephson devices is hereinafter compactly and interchangeably referred to as Multi-Path Interferometric Josephson ISolator (MPIJIS).

An MPIJIS 1) can be integrated on chip or printed circuit board (PCB), 2) does not use ferrites, 3) does not require strong magnets, 4) can be thermalized well, 5) can be made small/compact, and 6) has lighter weight as compared to presently available isolators. Furthermore, a commercial isolator always works to gate the flow in a single direction that is fixed for the isolator. In contrast, the direction of isolation in an MPIJIS can be reversed in situ by negating the phase difference between the two pump tones driving the device as described herein.

An embodiment provides an MPIJIS device, which can be implemented as a microwave isolator in a superconducting quantum circuit. Another embodiment provides fabrication method for the MPIJIS device, such that the method can be implemented as a software application. The application implementing a fabrication method embodiment can be configured to operate in conjunction with an existing semiconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example mixers, hybrids, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within an MPIJIS, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of a conceptual isolator function achieved by an MPIJIS in accordance with an illustrative embodiment. Symbol 102 represents an isolator, whether a prior-art cryogenic isolator or an MPIJIS operating as an isolator. Isolator 102 has two ports 104 and 106, either of which can receive an input signal. Operation 108 shows two scenarios. In one scenario, signal S is input from port 104. According to the direction of the arrow in symbol 102, isolator 102 is configured to pass signal S substantially unattenuated from port 1 to port 2. Accordingly, signal S appears at port 106 substantially unchanged in amplitude), as indicated by the substantially unchanged thickness of the arrow showing output from port 2 as compared to the input arrow at port 1. In the other scenario, signal S is input from port 2 (106). Isolator 102 blocks signal S in the direction from port 2 to port 1. Accordingly, signal S input from port 2 is heavily attenuated such that only a signal of an insignificant amplitude, ideally zero amplitude, appears at port 1 (104), as indicated by the insignificant thickness of the arrow showing output from port 1 as compared to the input arrow at port 2.

Scattering matrix 110 is a representation of a transmission parameter of ideal isolator 102 in four possible directions— signal input at port 1 and reflected back through port 1 ($S_{11}$), signal input at port 1 and transmitted to port 2 ($S_{21}$), signal input at port 2 and reflected back through port 2 ($S_{22}$), and signal input at port 2 and transmitted to port 1 ($S_{12}$).

Scattering matrix 110 is represented as [S]—

$$[S] = \begin{pmatrix} S_{11} & S_{12} \\ S_{21} & S_{22} \end{pmatrix}$$

where ideally $$[S] = \begin{pmatrix} 0 & 0 \\ 1 & 0 \end{pmatrix}$$

Meaning, isolator 102 reflects zero of signal input at port 1 back through port 1 ($S_{11}$=0), transmits unity, i.e., entirety of, signal input at port 1 to port 2 ($S_{21}$=1), reflects zero of signal input at port 2 back through port 2 ($S_{22}$=0), and transmits zero of signal input at port 2 to port 1 ($S_{12}$=0).

Figure 2:
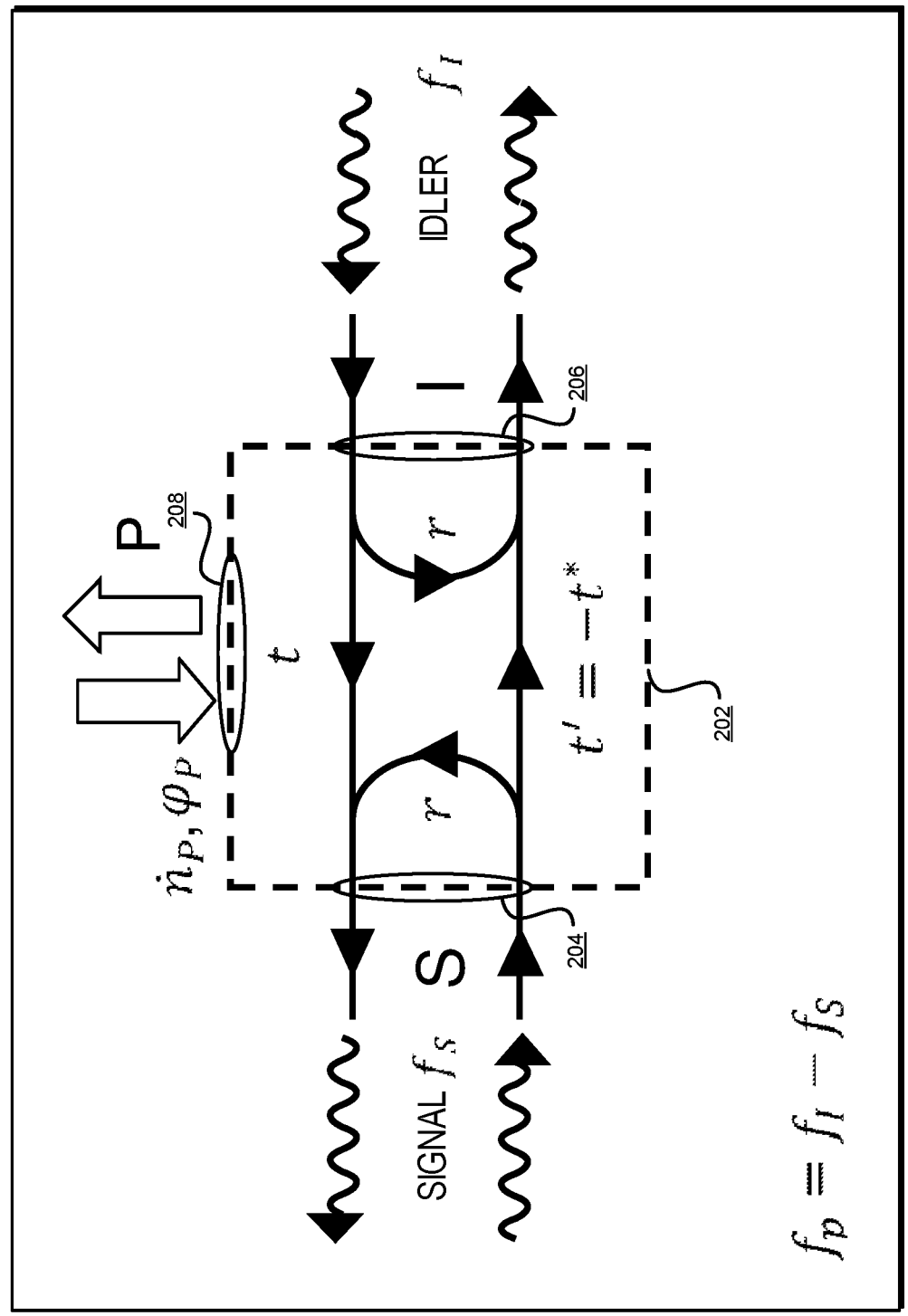
FIG. 2 depicts a block diagram of a signal flow graph for a nondegenerate three-wave mixing device operated in frequency conversion (no photon gain) in accordance with an illustrative embodiment.

With reference to FIG. 2, this figure depicts a signal flow graph for a nondegenerate three-wave mixing device operated in frequency conversion (no photon gain) in accordance with an illustrative embodiment. This nondegenerate three-wave mixing device could be used as part of the MPIJIS in a manner described herein. The nondegenerate three-wave mixer can be a Josephson parametric converter (JPC).

Superconducting nondegenerate three-wave mixer 202 has 3 ports, which are Signal port 204 (S) through which a microwave signal of frequency $f_S$ can be input, Idler port 206 (I) through which an idler microwave signal of frequency $f_I$ can be input, and pump port 208 (P) through which microwave signal of frequency $f_P$ and phase $\varphi_P$ can be input. In one configuration (without loss of generality), $f_I$ is a high frequency, $f_P$ is a low frequency, and $f_S$ is a medium frequency, when $f_P$, $f_S$, and $f_I$ are compared relative to each other (i.e., $f_I$>$f_S$>$f_P$). Superconducting nondegenerate three-wave mixer 202 is characterized as nondegenerate because it has two inputs—namely S and I.

Superconducting nondegenerate three-wave mixer 202 has transmission parameter t from Idler port to Signal port and transmission parameter t' from Signal port to Idler port. From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_P$, where $f_P$=$f_I$-$f_S$=$f_2$-$f_1$.

On resonance, the nondegenerate three-wave mixer (e.g., JPC) satisfies the following scattering matrix when operated in noiseless frequency conversion:

$$[S] = \begin{pmatrix} r & t \\ t' & r \end{pmatrix}$$

Since the scattering matrix is unitary, the following relation holds $|r|^2+|t|^2=1$, where r is the reflection parameter (how much of the signal is reflected back through the same port where the signal is input), t is the transmission parameter (how much of the signal input at one port is transmitted to another port), and t'=-t* (where t* is the conjugate of t). Unitary means that the nondegenerate three wave mixer preserves the energy and the coherence of the phase.

nondegenerate three-wave mixer 202 can be operated in three working modes, which are of special interest—

Working Mode 1: Perfect Mirror Working Point (Pump is Off):

$$|r|^2 = 1, |t|^2 = 0 \text{ and } [S] = \begin{pmatrix} 1 & 0 \\ 0 & 1 \end{pmatrix}$$

This means that the nondegenerate three-wave mixer reflects substantially all of the signal back through the input port (reflection parameters S11 and S22 are unity), and the nondegenerate three-wave mixer transmits substantially zero of the signal through to another port (transmission parameters $S_{21}$ and $S_{12}$ are 0).

Working Mode 2: Full Conversion Working Point:

$$|r|^2 = 0, |t|^2 = 1 \text{ and } [S] = \begin{pmatrix} 0 & ie^{-i\varphi_P} \\ ie^{i\varphi_P} & 0 \end{pmatrix}$$

In this mode, no reflection occurs and full transmission occurs with frequency conversion. This mode is dependent upon the pump amplitude which has to be set appropriately for this mode to become operational. The phase of the transmission parameters depends on the phase of the pump in a nonreciprocal manner (i.e., the phase acquired by signals propagating from the idler port to the signal port is $-\varphi_P$, whereas the phase acquired by signals propagating in the opposite direction is $\varphi_P$).

Working Mode 3: 50:50 Beam Splitter Working Point:

$$|r|^2 = \frac{1}{2}, |t|^2 = \frac{1}{2} \text{ and } [S] = \begin{pmatrix} \frac{1}{\sqrt{2}} & \frac{ie^{-i\varphi_P}}{\sqrt{2}} \\ \frac{ie^{i\varphi_P}}{\sqrt{2}} & \frac{1}{\sqrt{2}} \end{pmatrix}$$

This mode is dependent upon the pump amplitude which has to be set appropriately for this mode to become operational. The phase of the pump $\varphi_P$ (which are later denoted as $\varphi_1$ and $\varphi_2$ for two pump signals into two different nondegenerate three-wave mixers) will be utilized in accordance with the embodiments described herein. Phase $\varphi_P$ is added to the signal propagating from port S to port I, and phase $\varphi_P$ is subtracted from signal propagating from port I to port S.

Two suitable manifestations of nondegenerate three-wave mixer 202, each operating in mode 3 are used as one component in an MPIJIS according to the illustrative embodiments. JPC is one such non-limiting manifestation, which is a low noise microwave amplifier that is driven by a microwave signal, can be integrated on a chip, is light in weight, thermalizes well, is either loss-less or has insignificant energy loss, and employs no magnetic materials or strong magnetic flux in its operation, as compared to prior-art isolators.

Figure 3:
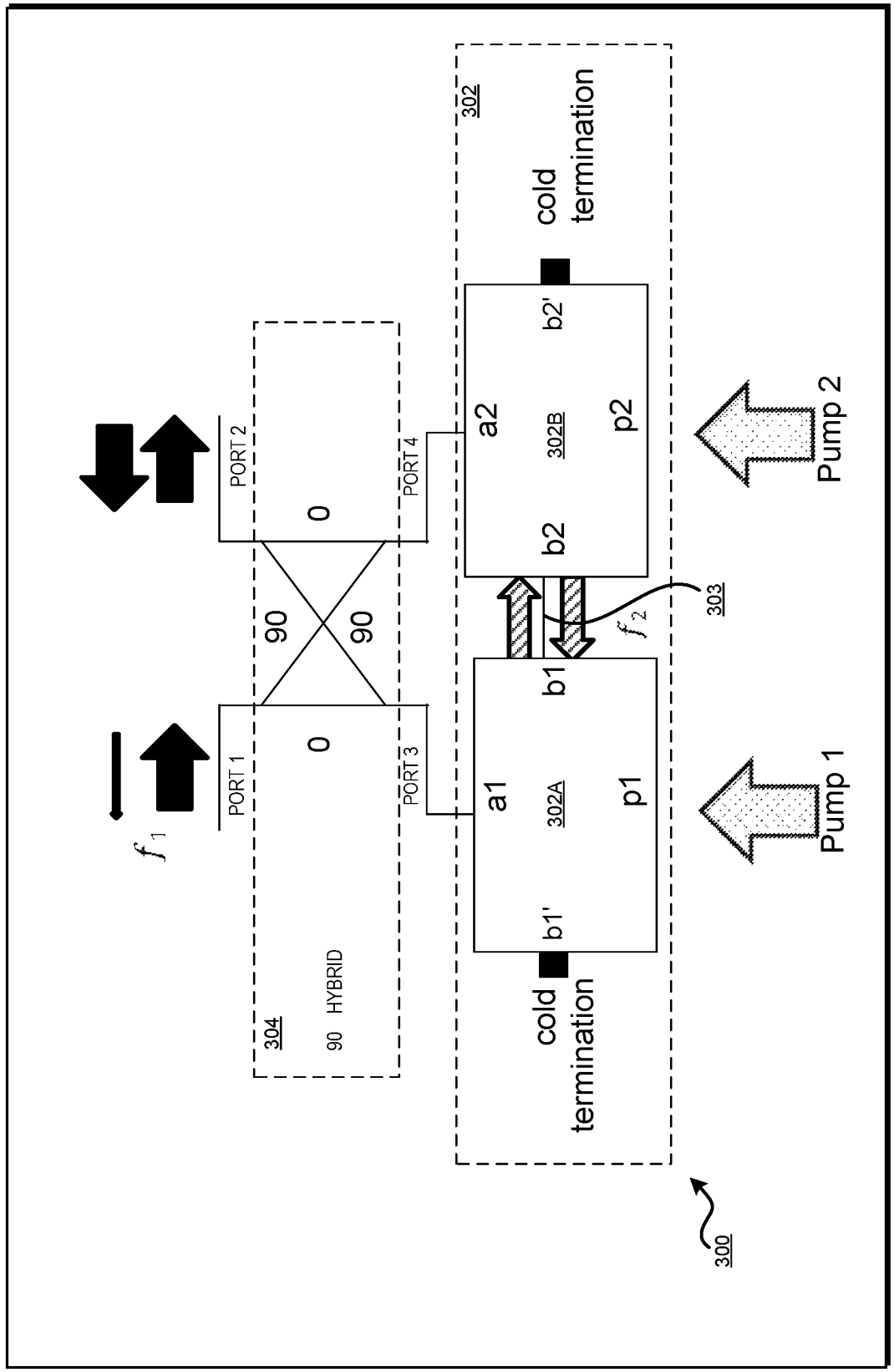
FIG. 3 depicts a block diagram of an example configuration of an MPIJIS in accordance with an illustrative embodiment.

With reference to FIG. 3, this figure depicts a block diagram of an example configuration of an MPIJIS in accordance with an illustrative embodiment. MPIJIS configuration 300 comprises pair 302 of nondegenerate three-wave mixer 302A and nondegenerate three-wave mixer 302B. Each of nondegenerate three-wave mixer 302A and nondegenerate three-wave mixer 302B is an example of nondegenerate three-wave mixer 202 in FIG. 2 with some variations as shown and described herein. nondegenerate three-wave mixers 302A and 302B are both operating in mode 3 at the beam splitter working point as described with respect to FIG. 2.

nondegenerate three-wave mixer 302A is configured with ports a1, b1, p1, and b1'. Physical port a1 corresponds to port S of nondegenerate three-wave mixer 202. Physical ports b1 and b1' correspond to port I of nondegenerate three-wave mixer 202 (or vice versa). Port p1 corresponds to port P of nondegenerate three-wave mixer 202. Physical port b1' is terminated as depicted in configuration 300, e.g., using a cold terminator. For example, the cold termination of port b1' may be a 50 Ohm termination. This configuration of nondegenerate three-wave mixer is described in FIG. 4.

Figure 4:
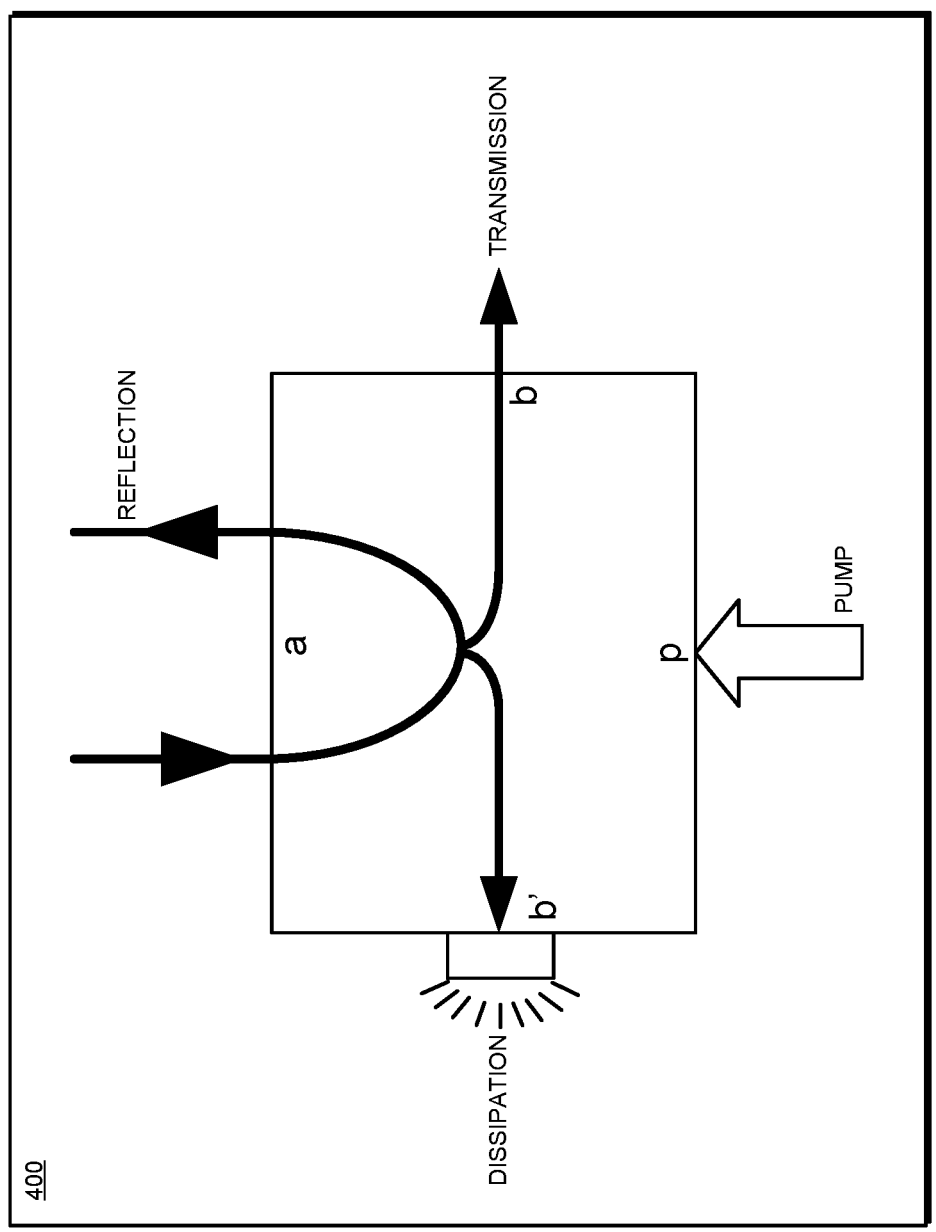
FIG. 4 depicts a schematic of a nondegenerate three-wave mixer configured in the manner of a nondegenerate three-wave mixer used in an MPIJIS according to an illustrative embodiment.

FIG. 4 shows a schematic of a nondegenerate three-wave mixer configured in the manner of a nondegenerate three-wave mixer used in an MPIJIS according to an illustrative embodiment. For example, schematic 400 corresponds nondegenerate three-wave mixers 302A and 302B in FIG. 3. In one embodiment, nondegenerate three-wave mixers 302A and 302B are nominally identical.

nondegenerate three-wave mixers 302A and 302B are coupled with each other via transmission line 303, which connects ports b1 and b2 of nondegenerate three-wave mixers 302A and 302B, respectively, as shown. Ideally, nondegenerate three-wave mixers 302A and 302B are coupled back-to-back with the length of transmission line 303 being substantially zero. Preferably, the length of transmission line 303 is as short as an implementation will allow on chip or in the printed circuit board (PCB).

A signal entering from port "a" (corresponding to port a1 of nondegenerate three-wave mixer 302A) can be split as follows—some part of the signal is reflected back out of port "a", some part of the signal is transmitted out from port "b", and some part of the signal is sent to port "b'" where that signal energy is dissipated. A microwave pump inputs microwave of a certain frequency and phase from port "p".

Figure 5:
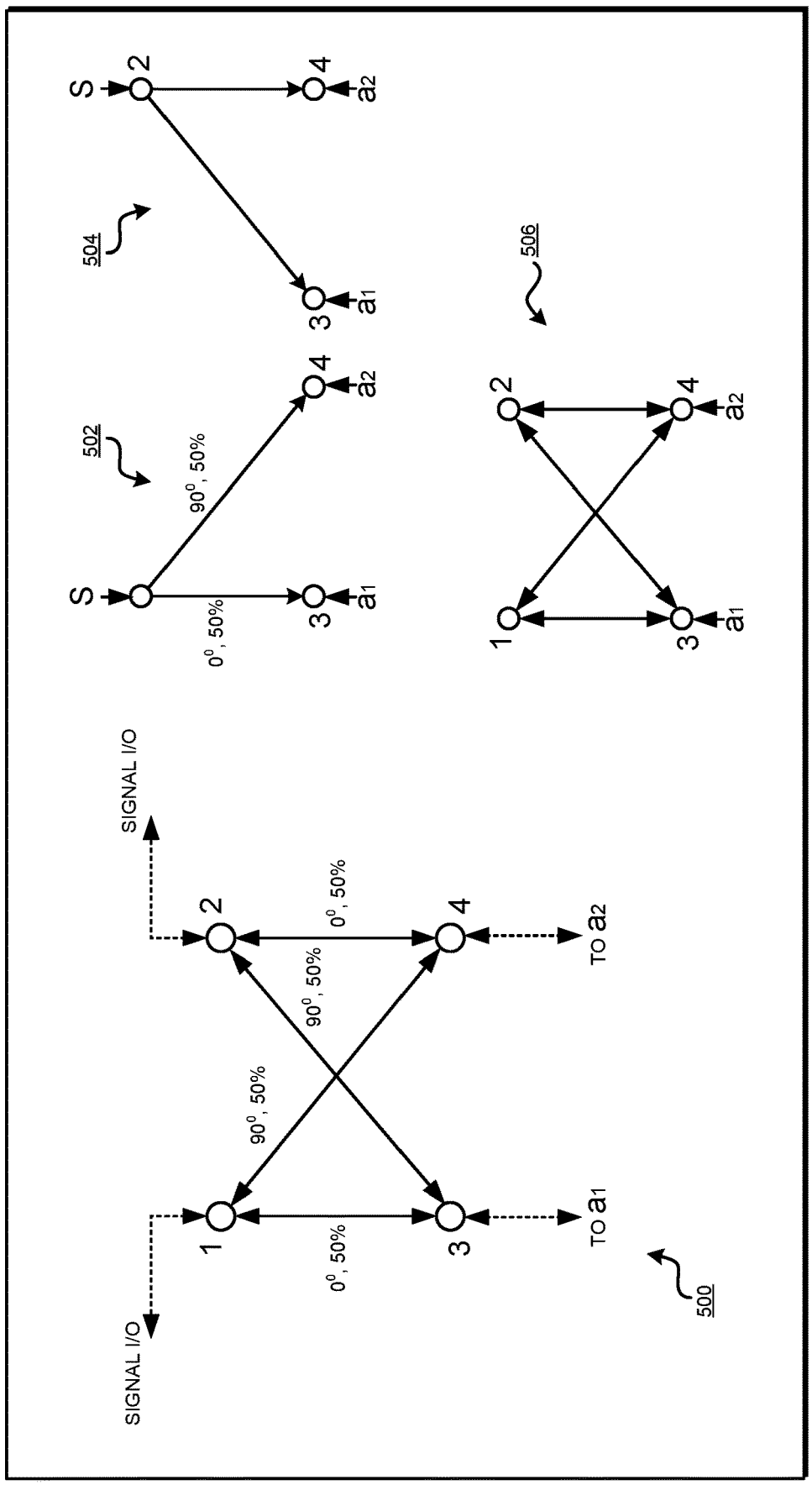
FIG. 5 depicts the modes and operations of a four-port 90-degree microwave hybrid device in accordance with an illustrative embodiment.

Returning to FIG. 3, component 304 is a device called a "hybrid". Hybrid 304 is a four-port 90-degree microwave device which operates as a microwave splitter or a microwave combiner (depending on the input and output ports used) while also phase-shifting along some paths and not others. FIG. 5 depicts and describes the operations of a hybrid device.

With reference to FIG. 5, this figure depicts the modes and operations of a four-port 90-degree microwave hybrid device in accordance with an illustrative embodiment. Four-port schematic 500 represents a microwave hybrid device that forms a component in MPIJIS 300 of FIG. 3. Ports 1 and 2 in hybrid 500 are ports where a signal S is either input or output to or from the hybrid, from or to a superconducting circuit (not shown). Each of ports 3 and 4 is connected to port "a" of a nondegenerate three-wave mixer, e.g., port "a" of nondegenerate three-wave mixer 400, or port "a1" of nondegenerate three-wave mixer 302A and port "a2" of nondegenerate three-wave mixer 302B. Ports 3 and 4 in hybrid 500 are ports where a portion of signal S is either input from the hybrid to a nondegenerate three-wave mixer (not shown), or an output signal is received from a nondegenerate three-wave mixer into the hybrid.

Splitter operation 502 shows that signal S when input at port 1 is split into two portions—one portion which is approximately fifty percent of the signal is delivered to port 3 without any phase shift (0-degree phase shift), and the other portion which is approximately fifty percent of the signal is delivered to port 4 with a 90-degree phase shift.

Splitter operation 504 shows that signal S when input at port 2 is split into two portions—one portion which is approximately fifty percent of the signal is delivered to port 4 without any phase shift (0-degree phase shift), and the other portion which is approximately fifty percent of the signal is delivered to port 3 with a 90-degree phase shift.

Operation 506 occurs in configuration 300 of the proposed MPIJIS. In such a case, operation 506 forms a combiner operation of hybrid 500. Suppose that the signal entering port "a" of a nondegenerate three-wave mixer is being reflected, at least in part, back out of port "a". Combiner operation 506 shows that a reflected signal when received at port hybrid 3 from port "a" of one nondegenerate three-wave mixer of the MPIJIS, is split into two portions—one portion which is approximately fifty percent of the signal is delivered to port 1 without any phase shift (0-degree phase shift), and the other portion which is approximately fifty percent of the signal is delivered to port 2 with a 90-degree phase shift. Similarly, combiner operation 506 further shows that a reflected signal when received at port hybrid 4 from port "a" of the other nondegenerate three-wave mixer of the MPIJIS, is split into two portions—one portion which is approximately fifty percent of the signal is delivered to port 2 without any phase shift (0-degree phase shift), and the other portion which is approximately fifty percent of the signal is delivered to port 1 with a 90-degree phase shift. The portions reaching port 1 from ports 3 and 4 are combined (via an interference phenomenon described herein) by hybrid 500 to be output from port 1. The portions reaching port 2 from ports 3 and 4 are combined (via an interference phenomenon described herein) by hybrid 500 to be output from port 2.

Back to FIG. 3, signal $f_1$ ($f_1$ is the signal frequency) is in resonance with the resonator of nondegenerate three-wave mixer 302A on port a1. Signal f2 ($f_2$ is the signal frequency) is a signal on a transmission line connecting nondegenerate three-wave mixer 302A with nondegenerate three-wave mixer 302B. signal $f_2$ is in resonance with the resonator of nondegenerate three-wave mixer 302A and/or nondegenerate three-wave mixer 302B on port b1 and/or port b2.

Pump input $f_p$ is a non-resonant tone whose frequency satisfies the condition $$f_p = f_2 - f_1$$

Pump phase $\varphi_1$ is a phase $\varphi_p$ of pump 1 input to nondegenerate three-wave mixer 302A. Pump phase $\varphi_2$ is a phase $\varphi_p$ of pump 2 input to nondegenerate three-wave mixer 302B. When $\varphi_1$ and $\varphi_2$ are selected according to an embodiment, MPIJIS 300 operates as an isolator whose direction can be reversed in situ. The isolator operation of MPIJIS 500 is a function of $(\varphi_1 - \varphi_2)$ and the amplitudes of the pump signals from pump 1 and pump 2. In one embodiment, the amplitude of pump 1 input into nondegenerate three-wave mixer 302A is substantially the same as the amplitude of pump 2 input into nondegenerate three-wave mixer 302B.

When operating as an isolator, MPIJIS 300 causes signal f1 to pass from port 1 of hybrid 304 to port 2 of hybrid 304 without any significant attenuation, but causes a very high attenuation of the signal if input at port 2 of hybrid 304 such that an insignificant (ideally zero) portion of that signal can be observed as output at port 1 of hybrid 304. The lack of attenuation in one direction and substantial attenuation in the opposite direction are depicted by the thicknesses of the dark patterned arrows adjacent to ports 1 and 2 of hybrid 304.

Figure 6:
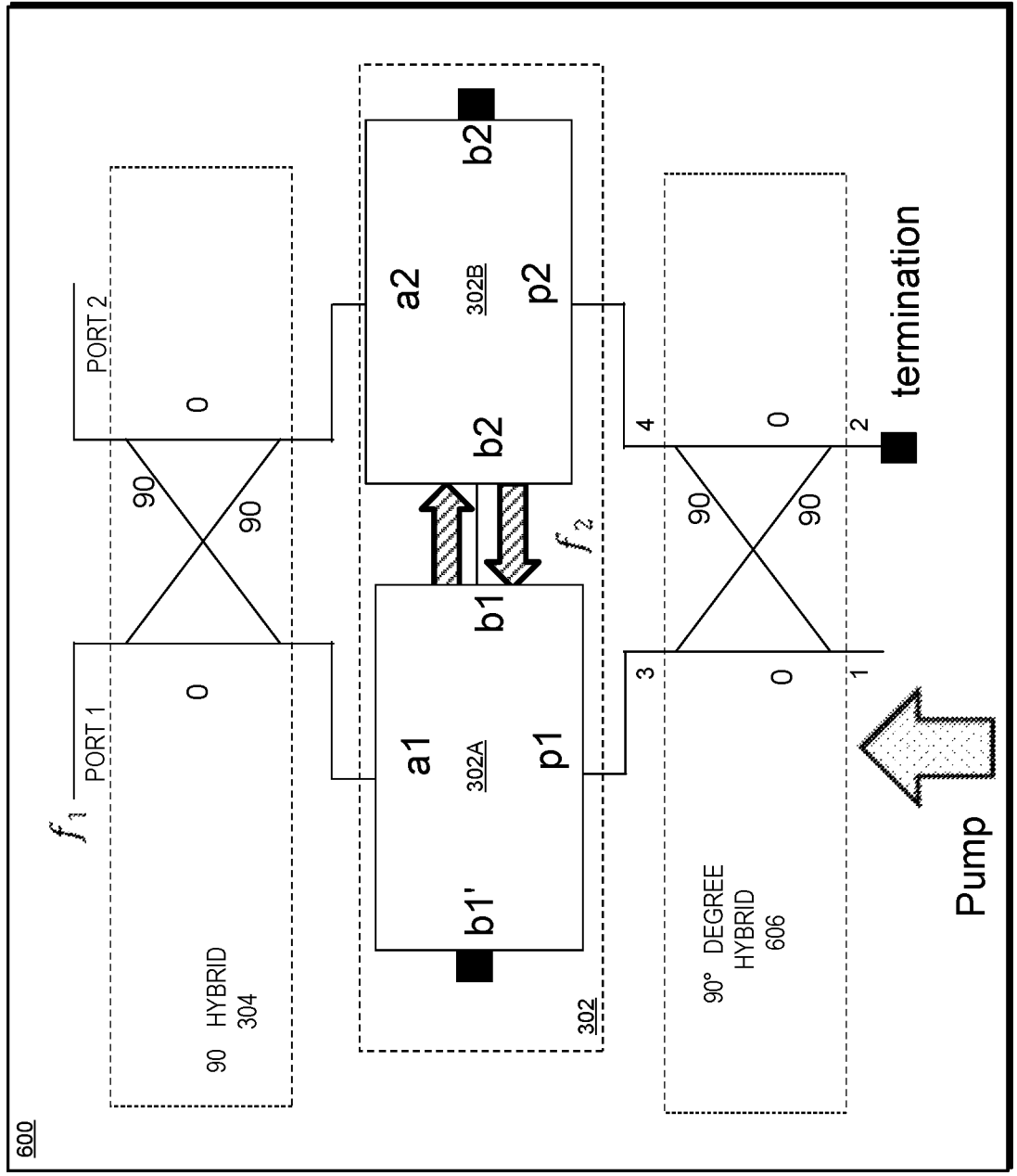
FIG. 6 depicts an alternate configuration for an MPIJIS in accordance with an illustrative embodiment.

With reference to FIG. 6, this figure depicts an alternate configuration for an MPIJIS in accordance with an illustrative embodiment. Pair 302 of nondegenerate three-wave mixers 302A and 302B is configured as in FIG. 3. 90-degree hybrid 304 is configured as described in FIGS. 3 and 5.

In configuration 600, a single pump is configured for use with both nondegenerate three-wave mixer 302A and nondegenerate three-wave mixer 302B via a second 90-degree hybrid—hybrid 606. Pump signal $f_p$ is applied to port 1 of hybrid 606. Port 2 of hybrid 606 is suitably terminated. Port 3 of hybrid 606 is coupled with port p1 of nondegenerate three-wave mixer 302A. Port 4 of hybrid 606 is coupled with port p2 of nondegenerate three-wave mixer 302B.

Figure 7:
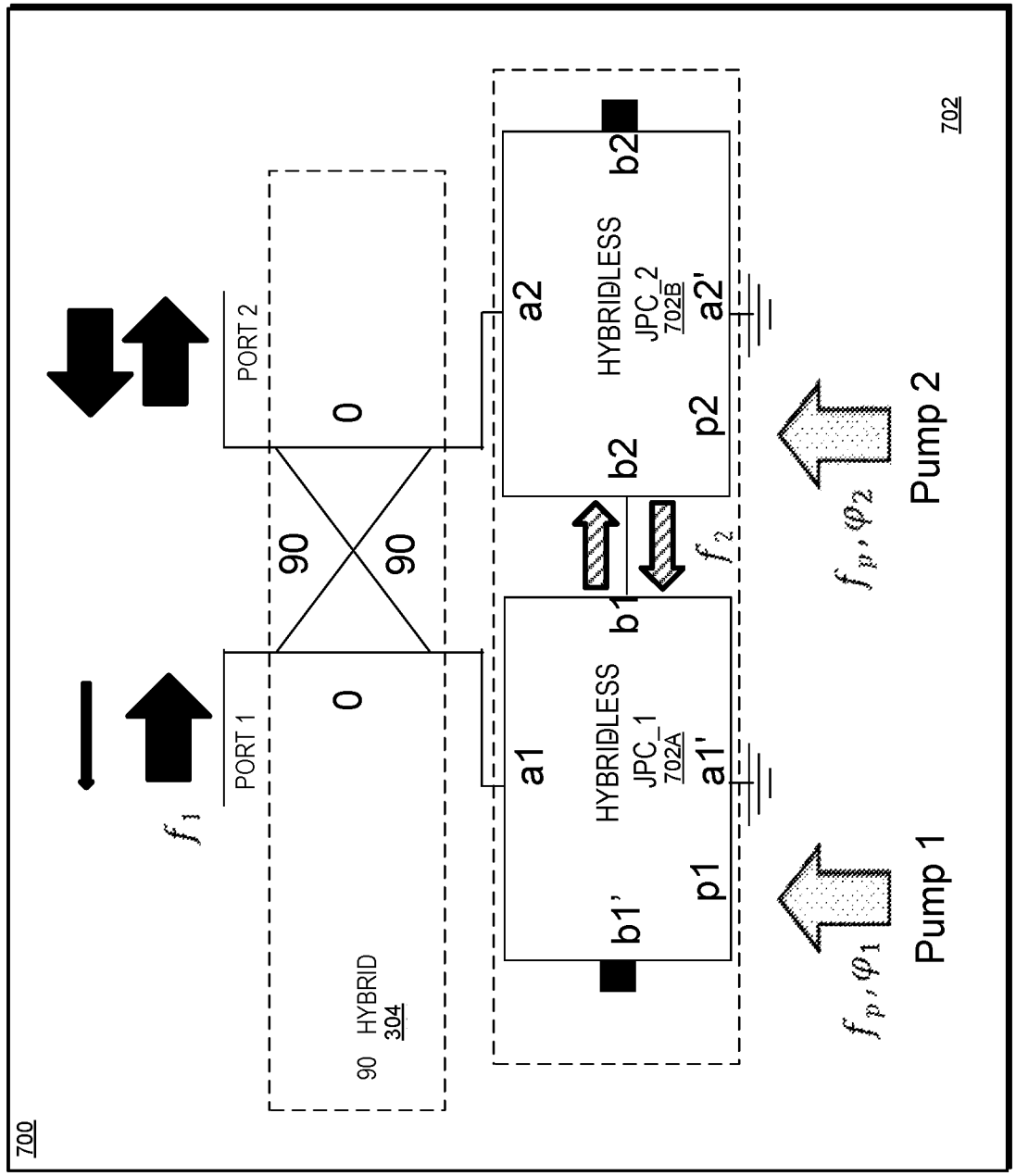
FIG. 7 depicts another alternate configuration for an MPIJIS in accordance with an illustrative embodiment.

With reference to FIG. 7, this figure depicts another alternate configuration for an MPIJIS in accordance with an illustrative embodiment. Pair 702 of nondegenerate three-wave mixers 702A and 702B is configured substantially as pair 302 of nondegenerate three-wave mixers 302A and 302B as in FIG. 3, except that nondegenerate three-wave mixers 702A and 702B are each a hybrid-less JPC manifestation of a nondegenerate three-wave mixer. 90-degree hybrid 304 is configured as described in FIGS. 3 and 5. In configuration 700, hybrid-less JPC 702A and hybrid-less JPC 702B each has an additional "a" port, namely a1' and a2', respectively, which is suitably terminated (e.g., grounded).

Figure 8:
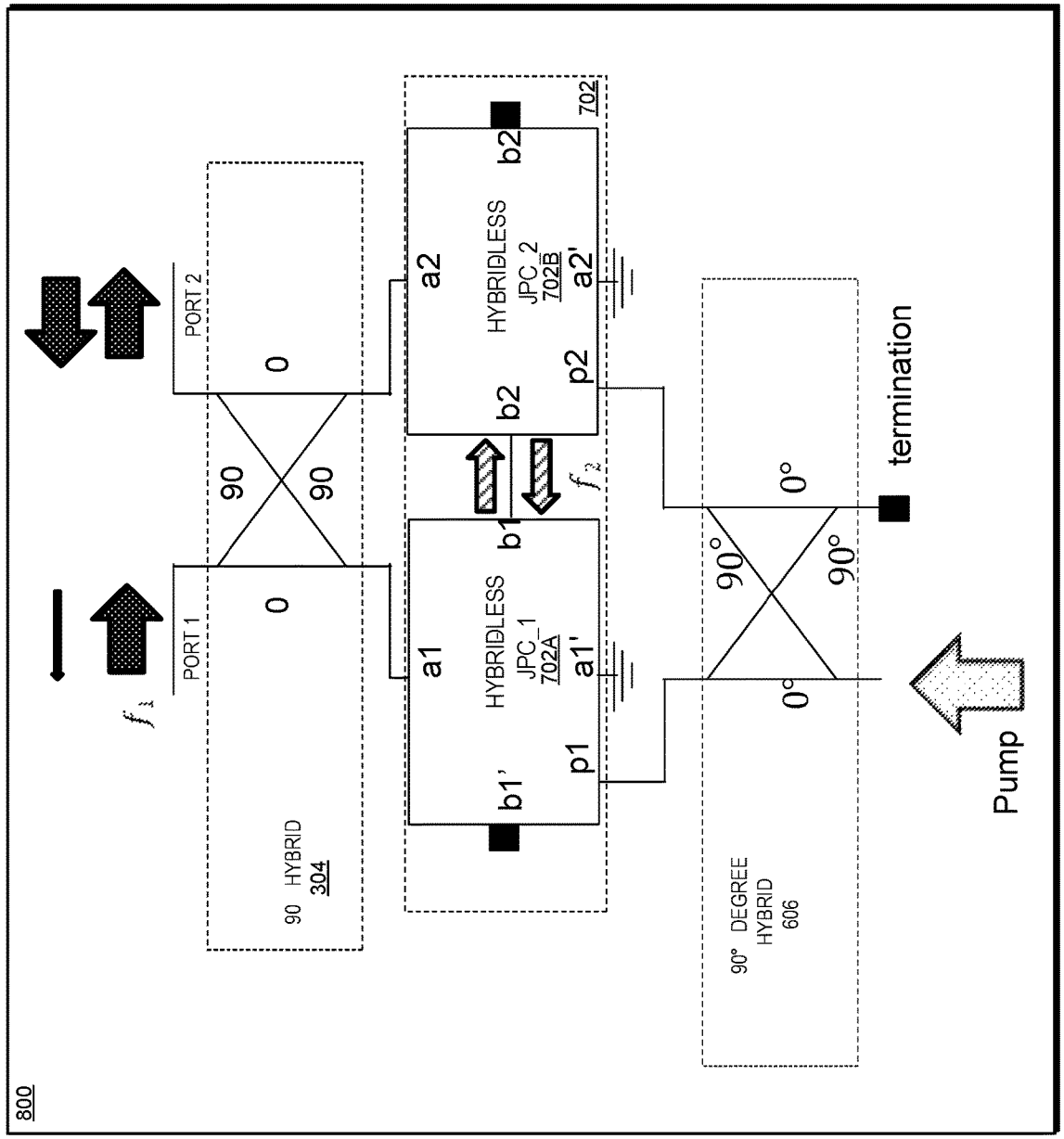
FIG. 8 depicts another alternate configuration for an MPIJIS in accordance with an illustrative embodiment.

With reference to FIG. 8, this figure depicts another alternate configuration for an MPIJIS in accordance with an illustrative embodiment. Configuration 800 is a combination of configurations 600 and 700, whereby a single pump is used in conjunction with hybrid 606 to provide the pump input to hybrid-less JPC 702A and hybrid-less JPC 702B.

Figure 9A:
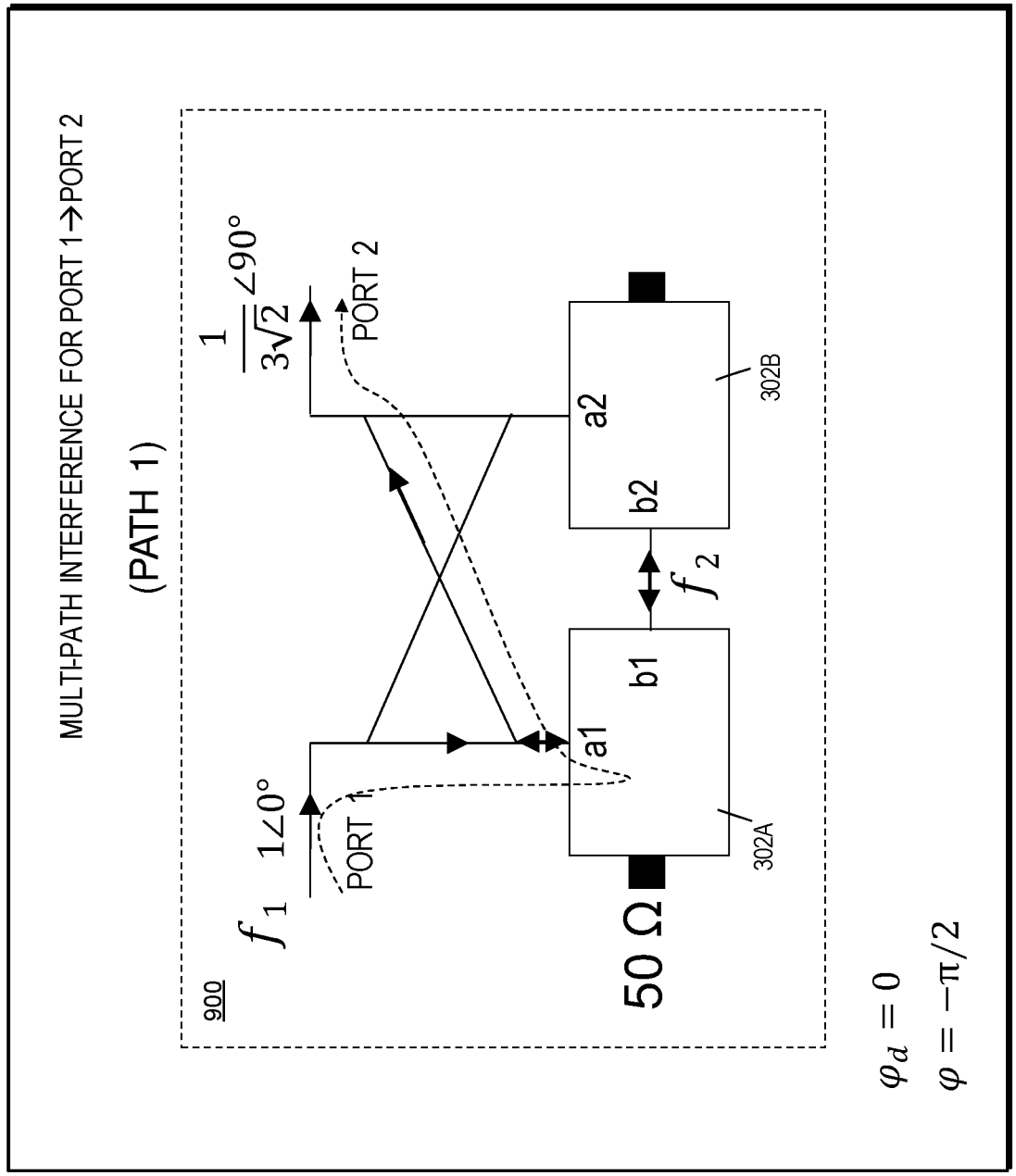
FIG. 9A depicts one signal path in an MPIJIS according to an illustrative embodiment.

With reference to FIG. 9A, this figure depicts one signal path in an MPIJIS according to an illustrative embodiment. MPIJIS 900 is representative of MPIJIS 300 or any of its configuration variants 600, 700, or 800. This path, (path 1), in MPIJIS 900 contributes to $S_{21}$ in the scatter matrix [S] of the MPIJIS. Recall that $S_{21}$ is the transmission parameter for the transmission from port 1 to port 2.

A signal at frequency $f_1$ and relative phase 0 is input to port 1 of MPIJIS 900 and this input is denoted as 120°, which means that the signal's normalized amplitude is 1 and the signal's relative phase is 0°. Path 1 is illustrated by the dotted line traversing MPIJIS 900 from port 1 to port 2. The contribution of this path to the output at port 2 is denoted as $$\frac{1}{3\sqrt{2}} \angle 90°,$$

meaning that the signal's normalized amplitude is $$\frac{1}{3\sqrt{2}}$$

and the signal's relative phase is 90°.

Figure 9B:
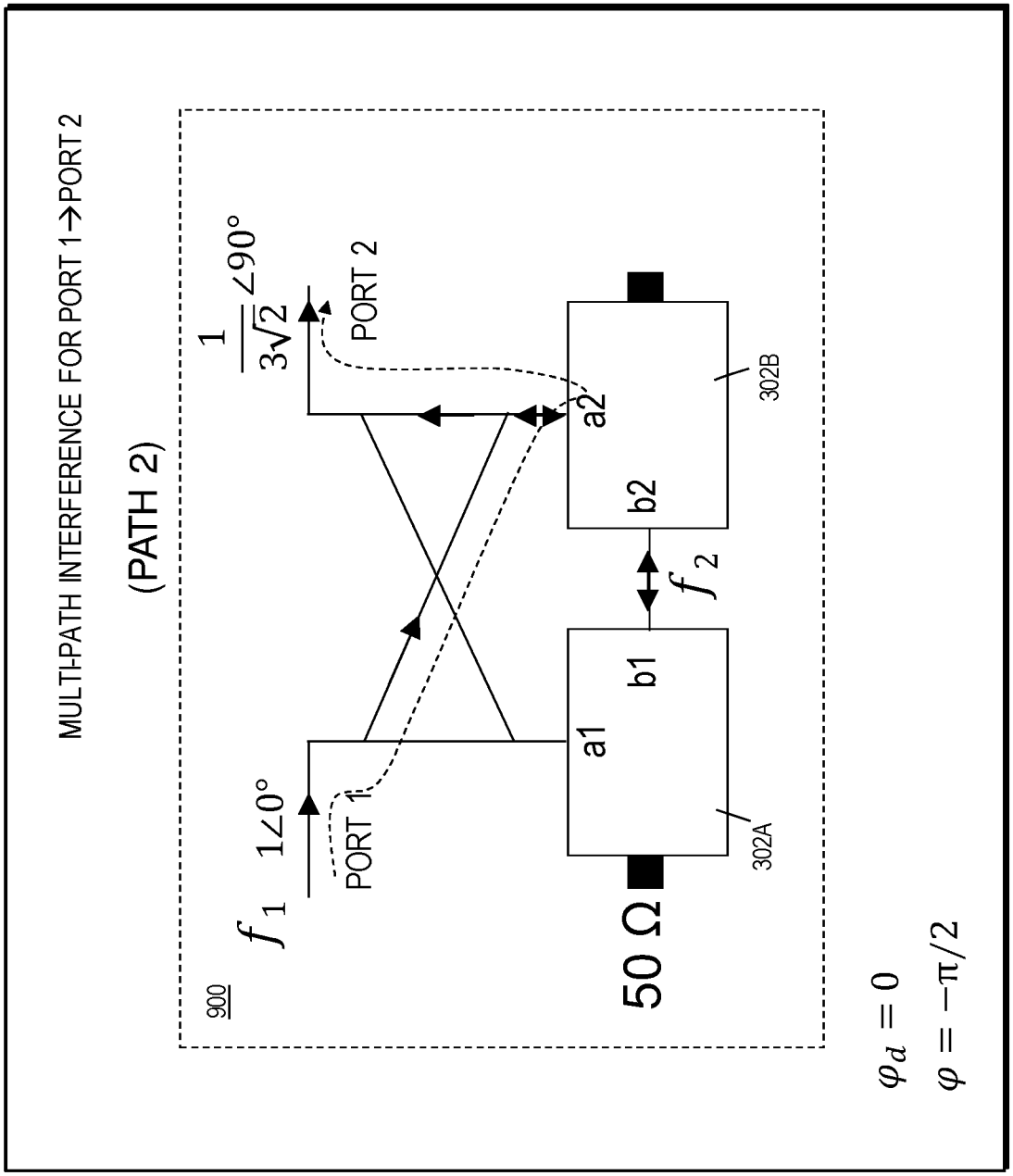
FIG. 9B depicts a second signal path in an MPIJIS according to an illustrative embodiment.

With reference to FIG. 9B, this figure depicts a second signal path in an MPIJIS according to an illustrative embodiment. This path, (path 2), of signal $f_1$ 120° in MPIJIS 900 also contributes to $S_{21}$ in the scatter matrix [S] of the MPIJIS. Path 2 is illustrated by the dotted line traversing MPIJIS 900 from port 1 to port 2. The contribution of this path to the output at port 2 is denoted as $$\frac{1}{3\sqrt{2}} \angle 90°,$$

meaning that the signal's normalized amplitude is $$\frac{1}{3\sqrt{2}}$$

and the signal's relative phase is 90°.

Figure 9C:
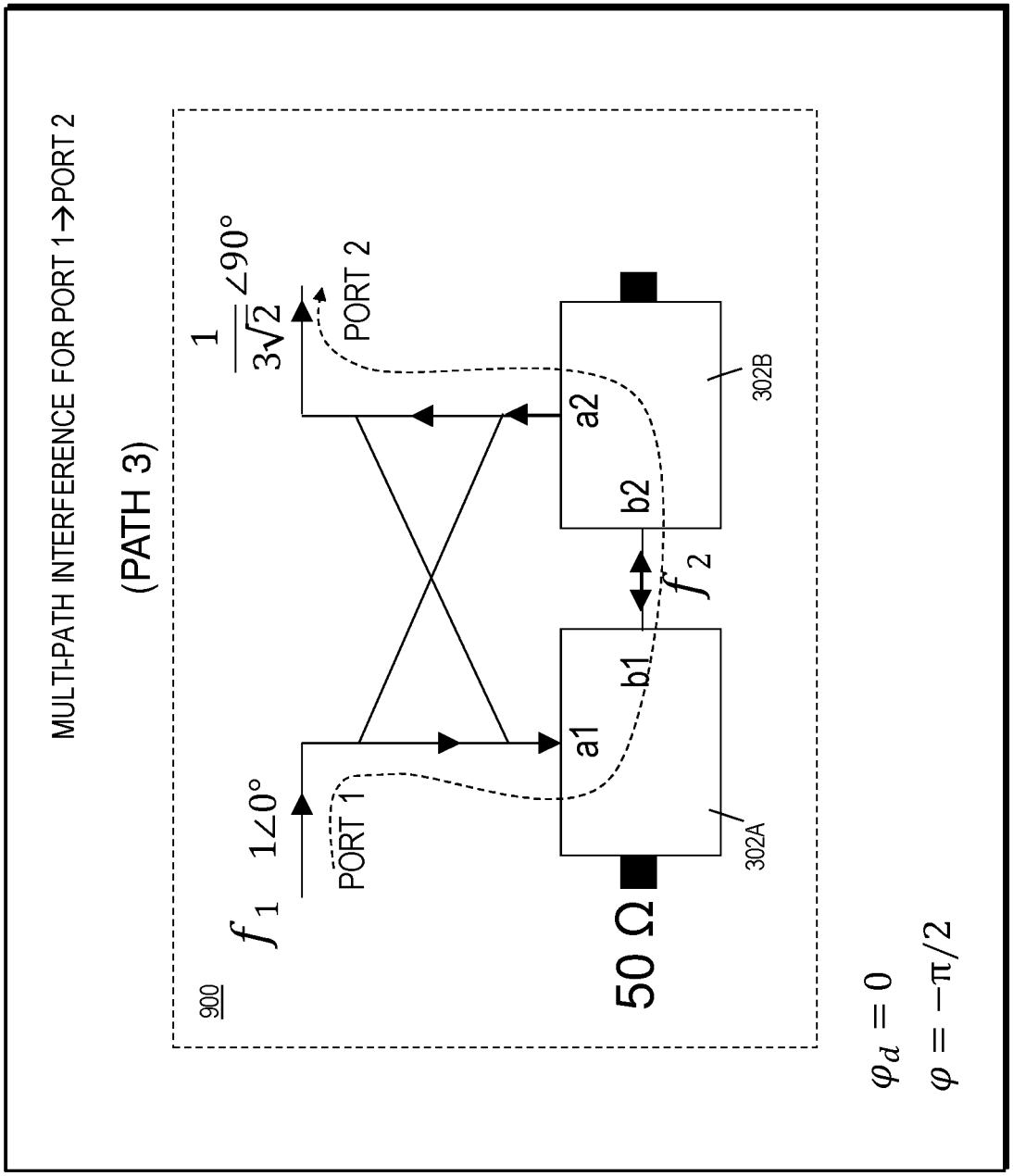
FIG. 9C depicts a third signal path in an MPIJIS according to an illustrative embodiment.

With reference to FIG. 9C, this figure depicts a third signal path in an MPIJIS according to an illustrative embodiment. This path, (path 3), of signal $f_1$ 120° in MPIJIS 900 also contributes to $S_{21}$ in the scatter matrix [S] of the MPIJIS. Path 3 is illustrated by the dotted line traversing MPIJIS 900 from port 1 to port 2. The contribution of this path to the output at port 2 is denoted as $$\frac{1}{3\sqrt{2}} \angle 90°,$$

meaning that the signal's normalized amplitude is $$\frac{1}{3\sqrt{2}}$$

and the signal's relative phase is 90°.

Figure 9D:
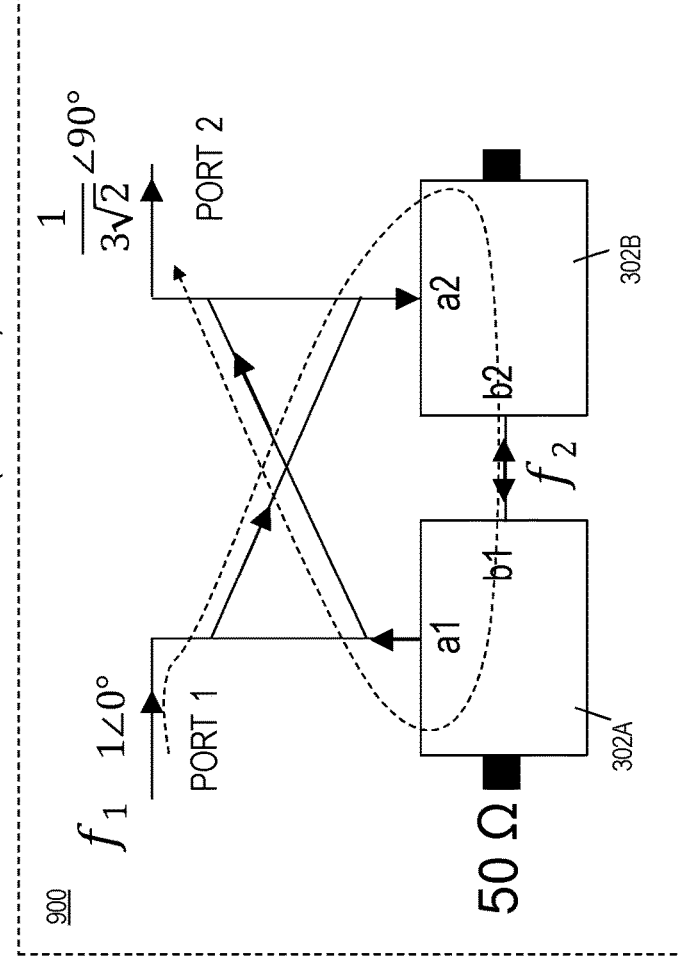
FIG. 9D depicts a fourth signal path in an MPIJIS according to an illustrative embodiment.

With reference to FIG. 9D, this figure depicts a fourth signal path in an MPIJIS according to an illustrative embodiment. This path, (path 4), of signal $f_1$ 120° in MPIJIS 900 also contributes to $S_{21}$ in the scatter matrix [S] of the MPIJIS. Path 4 is illustrated by the dotted line traversing MPIJIS 900 from port 1 to port 2. The contribution of this path to the output at port 2 is denoted as $$\frac{1}{3\sqrt{2}} \angle 90°,$$

meaning that the signal's normalized amplitude is $$\frac{1}{3\sqrt{2}}$$

and the signal's relative phase is 90°.

Thus, the constructive interference between the four principal paths—paths 1, 2, 3, and 4—provides:

$$|S_{21}|^2 = \left|4\frac{1}{3\sqrt{2}}\right|^2 = 0.8889$$

Figure 10A:
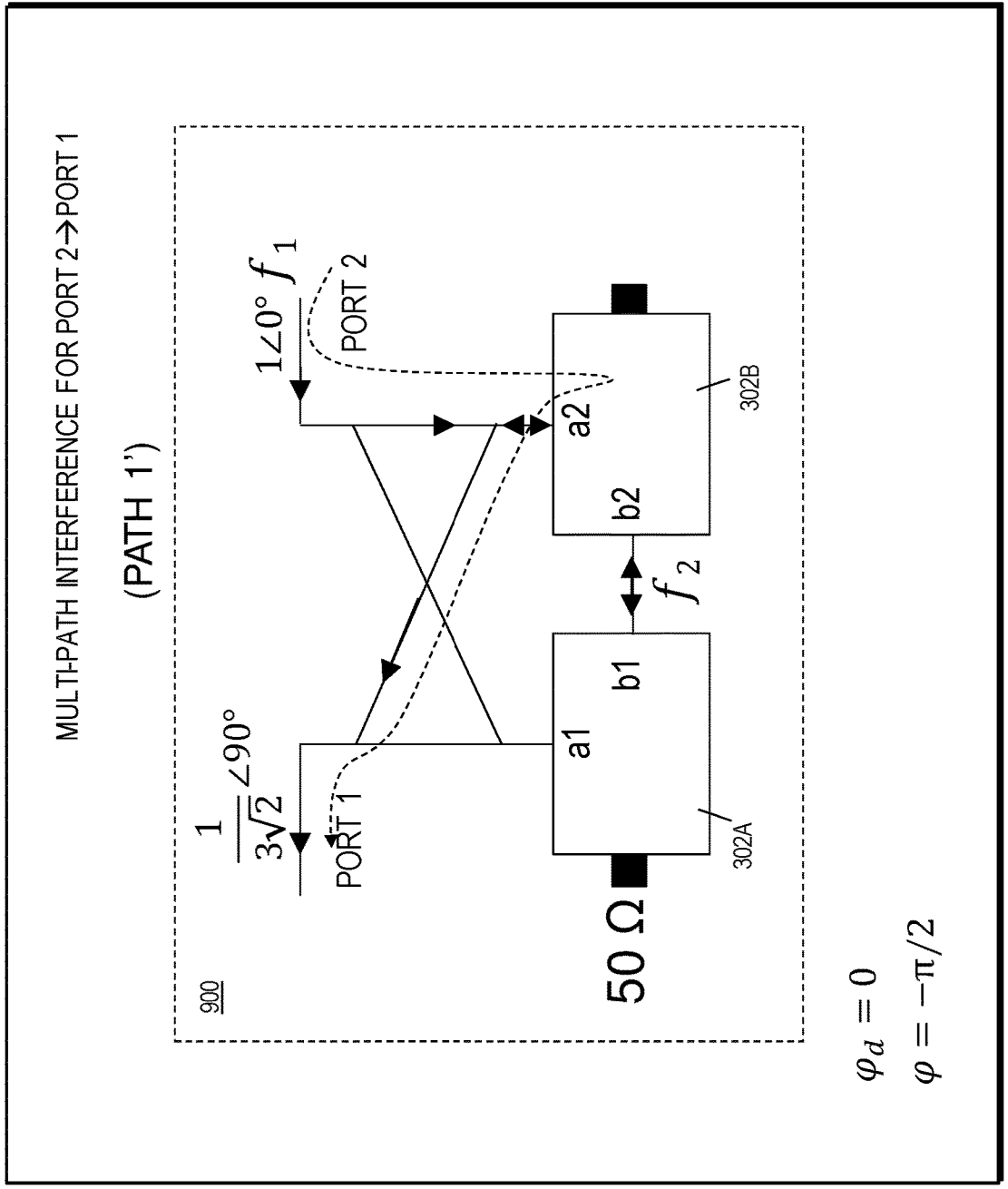
FIG. 10A depicts one opposite signal path in an MPIJIS according to an illustrative embodiment.

With reference to FIG. 10A, this figure depicts one opposite signal path in an MPIJIS according to an illustrative embodiment. MPIJIS 900 is representative of MPIJIS 300 or any of its configuration variants 600, 700, or 800. This path, (path 1'), in MPIJIS 900 contributes to $S_{12}$ in the scatter matrix [S] of the MPIJIS. Recall that $S_{12}$ is the transmission parameter for the transmission from port 2 to port 1.

A signal at frequency $f_1$ and relative phase 0 is input to port 2 of MPIJIS 900 and this input is denoted as 120°, which means that the signal's normalized amplitude is 1 and the signal's relative phase is 0°. Path 1' is illustrated by the dotted line traversing MPIJIS 900 from port 2 to port 1. The contribution of this path to the output at port 1 is denoted as $$\frac{1}{3\sqrt{2}} \angle 90°,$$

meaning that the signal's normalized amplitude is $$\frac{1}{3\sqrt{2}}$$

and the signal's relative phase is 90°.

Figure 10B:
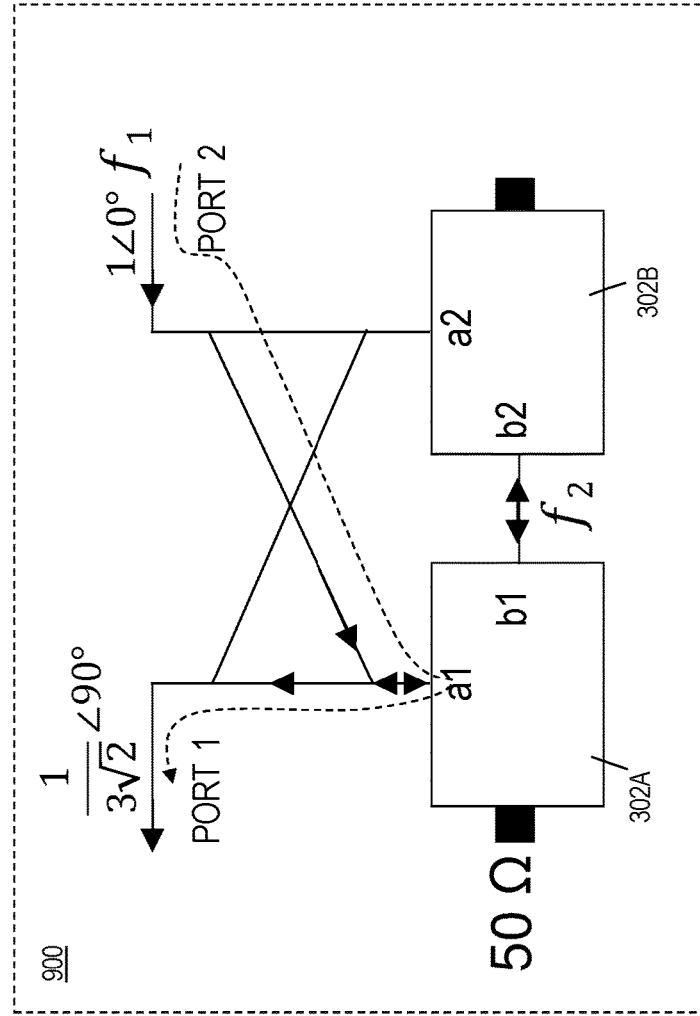
FIG. 10B depicts a second opposite signal path in an MPIJIS according to an illustrative embodiment.

With reference to FIG. 10B, this figure depicts a second opposite signal path in an MPIJIS according to an illustrative embodiment. This path, (path 2'), of signal $f_1$ 120° in MPIJIS 900 also contributes to $S_{12}$ in the scatter matrix [S] of the MPIJIS. Path 2' is illustrated by the dotted line traversing MPIJIS 900 from port 2 to port 1. The contribution of this path to the output at port 1 is denoted as $$\frac{1}{3\sqrt{2}} \angle 90°,$$

meaning that the signal's normalized amplitude is $$\frac{1}{3\sqrt{2}}$$

and the signal's relative phase is 90°.

Figure 10C:
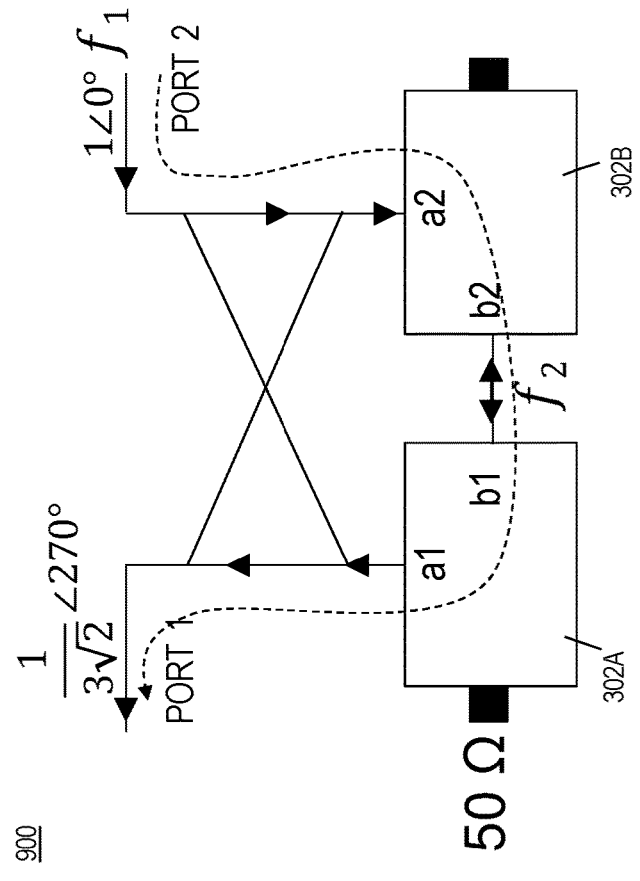
FIG. 10C depicts a third opposite signal path in an MPIJIS according to an illustrative embodiment.

With reference to FIG. 10C, this figure depicts a third opposite signal path in an MPIJIS according to an illustrative embodiment. This path, (path 3'), of signal $f_1$ 120° in MPIJIS 900 also contributes to $S_{12}$ in the scatter matrix [S] of the MPIJIS. Path 3' is illustrated by the dotted line traversing MPIJIS 900 from port 2 to port 1. The contribution of this path to the output at port 2 is denoted as $$\frac{1}{3\sqrt{2}} \angle 270°,$$

meaning that the signal's normalized amplitude is $$\frac{1}{3\sqrt{2}}$$

and the signal's relative phase is 270° (180 degrees out of phase with the contributions of paths 1' and 2').

Figure 10D:
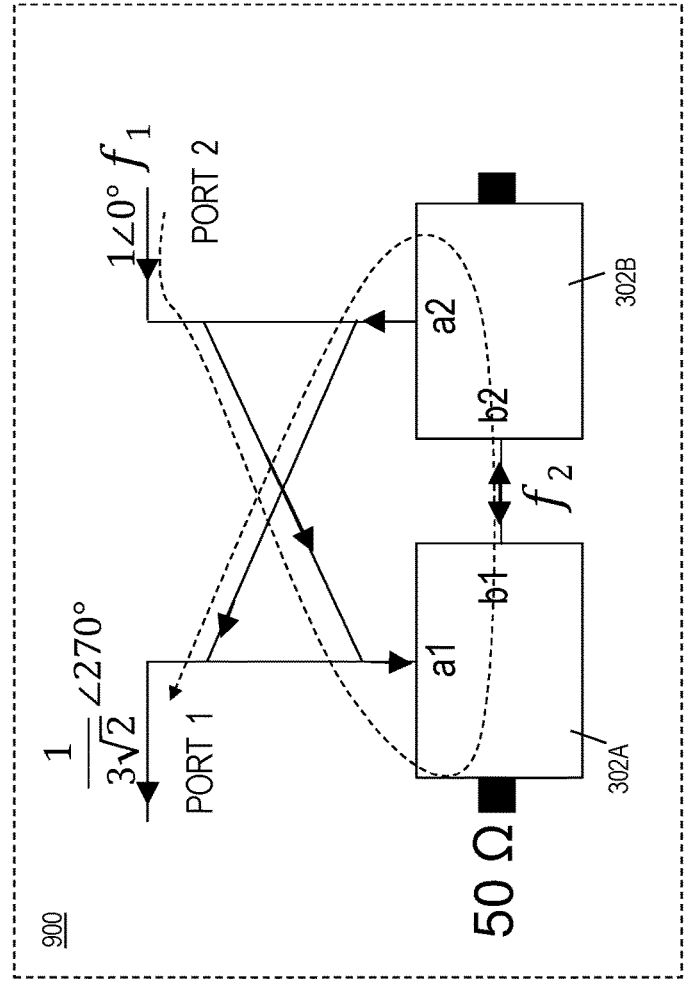
FIG. 10D depicts a fourth opposite signal path in an MPIJIS according to an illustrative embodiment.

With reference to FIG. 10D, this figure depicts a fourth opposite signal path in an MPIJIS according to an illustrative embodiment. This path, (path 4'), of signal $f_1$ 120° in MPIJIS 900 also contributes to $S_{12}$ in the scatter matrix [S] of the MPIJIS. Path 4' is illustrated by the dotted line traversing MPIJIS 900 from port 2 to port 1. The contribution of this path to the output at port 2 is denoted as $$\frac{1}{3\sqrt{2}} \angle 270°,$$

meaning that the signal's normalized amplitude is $$\frac{1}{3\sqrt{2}}$$

and the signal's relative phase is 270° (180 degrees out of phase with the contributions of paths 1' and 2').

Thus, the destructive interference between the four principal opposite paths—paths 1', 2', 3', and 4'—provides:

$$|S_{12}|^2 = \left|2\frac{1}{3\sqrt{2}} - 2\frac{1}{3\sqrt{2}}\right|^2 = 0$$

With reference to FIG. 11, this figure depicts a generalized signal flow graph of an MPIJIS in accordance with an illustrative embodiment.

Figure 12:
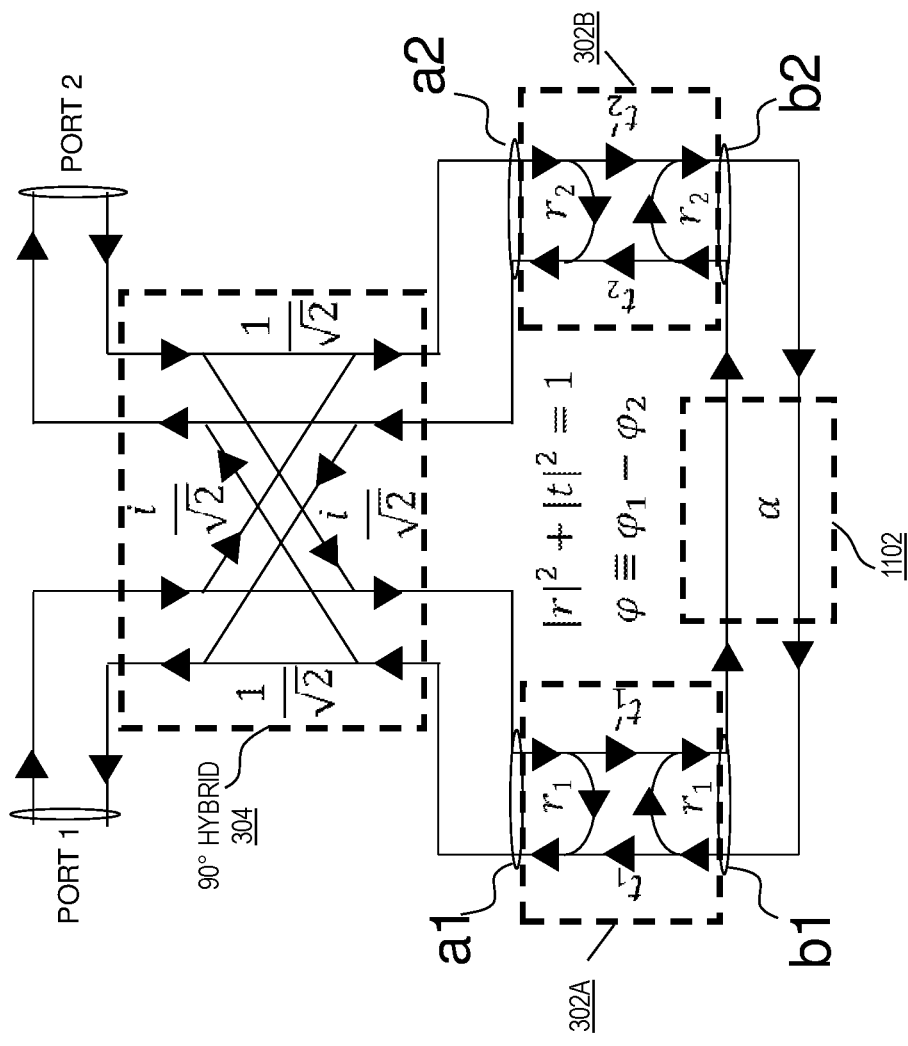
FIG. 12 depicts a simplified signal flow graph of an MPIJIS in accordance with an illustrative embodiment.

With reference to FIG. 12, this figure depicts a simplified signal flow graph of an MPIJIS in accordance with an illustrative embodiment.

In the signal flow graphs of FIGS. 11 and 12, the two ports b1 and b2 of the nondegenerate three-wave mixers 302A and 302B are connected together at ports b1 and b2, respectively, through an effective symmetric coupler 1102 (e.g., 90 degree hybrid), which couples these ports and cold terminations. In one implementation, as in the depiction of FIG. 12, the effective coupler 1102 is replaced by a lossy transmission line with amplitude attenuation $|\alpha|$. The phase acquired by signals at frequency $f_2$ propagating along the transmission line is Argument($\alpha$) (i.e., the phase of the complex number $\alpha$).

The signal flow graph shows the signal flow through ports 1 and 2, 90° hybrid coupler 304, nondegenerate three-wave mixer 302A, nondegenerate three-wave mixer 302B, and the effective coupler 1102. The scheme for the signal flow is lossless. The effective coupler 1102 has a real transmission parameter $\alpha$ for signals propagating at frequency $f_2$ between ports b1 and b2 that are connected together (the real parameter means there is no acquired phase by signals propagating between ports b1 and b2). The two nondegenerate three-wave mixers are (assumed to be) nominally identical. The scattering parameters of MPIJIS 900 at a certain working point are determined by wave interference between 4 principal forward paths depicted in FIGS. 9A-D and 4 principal opposite paths depicted in FIGS. 10A-D (although there are multiple (or infinite) possible paths in each direction due to infinite number of possible beam traversals between b1 and b2).

The scattering parameter on resonance from port i to j (where i,j∈{1,2}) vanishes if the waves that propagate from i to j interfere destructively, as in FIGS. 10A-D. The scattering parameter on resonance from port i to j (where i,j∈{1,2}) is almost unity if the waves that propagate from i to j interfere constructively, as in FIGS. 9A-D.

The pump is assumed to be enabled where $$|r| = |t| = \frac{1}{\sqrt{2}}$$

and the phase difference is $\varphi \equiv \varphi_1 - \varphi_2$. The amplitude attenuation coefficient of the lossy transmission line 1102, shown in FIG. 12, is defined as $\alpha = |\alpha|e^{i\varphi_d}$. Phase shift acquired by signals propagating along the transmission line 1102 (between ports b1 and b2) at $f_2$ is $\varphi_d = \omega_2 \tau_d$. The angular frequency of microwave signals at $f_2$ is $\omega_2 = 2\pi f_2$. The delay time of the delay/transmission line 1102 is $$\tau_d = \frac{l_d \sqrt{\varepsilon}}{c},$$

where c is the speed of light, $l_d$ is the effective electrical length of the transmission line (1102), and $\varepsilon$ is the effective dielectric constant of the transmission line 1102.

In the signal graph of FIG. 11, $r_1$ and $r_2$ are the reflection coefficients, $t_1$, $t'_1$, $t_2$, and $t'_2$ are the transmission parameters of nondegenerate three-wave mixers 302A and 302B, respectively, where $t'_1 = -t^*_1$ (where $t^*_1$ is the conjugate of $t_1$) and where $t'_2 = -t^*_2$ (where $t^*_2$ is the conjugate of $t_2$). It is presumed that t is equal to or about equal $t_2$ and $r_2$ is equal to or about equal to $r_2$.

It should be appreciated that there are numerous paths for the signal at $f_1$ entering the port 1 to follow in MPIJIS 900 and/or for the signal at $f_1$ entering the port 2 to follow. For any signal at $f_1$ entering the port 1 or port 2, wave interference results in 4 forward or opposite principal paths, respectively, that determine transmission and/or reflection, based on the phase difference $\varphi$.

For ease of understanding and explanation, headings are utilized below. It should be appreciated that the headings are not meant to be limiting.

Figure 13:
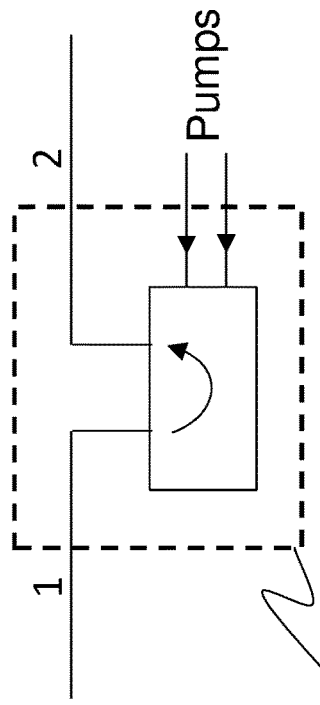
FIG. 13 depicts device equations for MPIJIS 900 based on the simplified signal flow graph of FIG. 12.

I. FIG. 13 depicts device equations for MPIJIS 900 based on the simplified signal flow graph of FIG. 12

First, using the scattering matrix $$[S] = \begin{pmatrix} S_{11} & S_{12} \\ S_{21} & S_{22} \end{pmatrix},$$

the scattering parameters on the diagonal are $S_{21}$ and $S_{22}$ which define the reflection parameters. The scattering parameters on the off diagonal are $S_{21}$ and $S_{22}$ which define the transmission parameters. The results of the S matrix are (Equations A)

$$S_{11} = \tfrac{1}{2}(S_{a1a1} - S_{a2a2} + iS_{a2a1} + iS_{a1a2})$$

$$S_{22} = \tfrac{1}{2}(S_{a2a2} - S_{a1a1} + iS_{a2a1} + iS_{a1a2})$$

$$S_{21} = \tfrac{1}{2}(iS_{a1a1} + iS_{a2a2} + S_{a2a1} - S_{a1a2})$$

$$S_{12} = \tfrac{1}{2}(iS_{a1a1} + iS_{a2a2} + S_{a1a2} - S_{a2a1})$$

Intermediate results are $$S_{a1a1} = r_1 + \frac{r_2 t_1 t'_1 \alpha^2}{1 - r_1 r_2 \alpha^2}$$

$$S_{a1a2} = \frac{t_1 t'_2 \alpha}{1 - r_1 r_2 \alpha^2}$$

$$S_{a2a2} = r_2 + \frac{r_1 t_2 t'_2 \alpha^2}{1 - r_1 r_2 \alpha^2}$$

$$S_{a2a1} = \frac{t_2 t'_1 \alpha}{1 - r_1 r_2 \alpha^2}$$

which can be rewritten as (Equations B)

$$S_{a1a1} = r_1 - \frac{e^{2i\varphi_d} r_2 |t_1|^2 |\alpha|^2}{1 - r_1 r_2 e^{2i\varphi_d} |\alpha|^2}$$

$$S_{a1a2} = -\frac{|t_1||t'_2||\alpha|e^{i(\varphi_d - \varphi)}}{1 - r_1 r_2 e^{2i\varphi_d} |\alpha|^2}$$

$$S_{a2a2} = r_2 - \frac{e^{2i\varphi_d} r_1 |t_2|^2 |\alpha|^2}{1 - r_1 r_2 e^{2i\varphi_d} |\alpha|^2}$$

$$S_{a2a1} = -\frac{|t_2||t'_1||\alpha|e^{i(\varphi_d + \varphi)}}{1 - r_1 r_2 e^{2i\varphi_d} |\alpha|^2}$$

where $\varphi \equiv \varphi_1 - \varphi_2$.

It should be noted that, for example, the nomenclature $S_{21}$ represents a scattering parameter (transmission parameter) for a signal (at frequency $f_1$) entering from port 1 and exiting port 2, as understood by one skilled in the art. Similarly, for example, the nomenclature $S_{a1a2}$ represents a scattering parameter (transmission parameter) for a signal entering port a2 and exiting port a1. As can be seen in the equations above, $S_{11}$, $S_{22}$, $S_{21}$, and $S_{12}$ each have 4 principal paths given the wave interference as understood by one skilled in the art, although the actual different possible paths between port 1 and 2 (and vice versa) are numerous or infinite because of the self-loop between the idler resonators (e.g., between coupled ports b1 and b2). However, the scattering parameters in Equations B account for all possible paths and subsequently the scattering parameters for the whole device in Equations A. Additionally, the scattering parameters $S_{11}$ and $S_{21}$ define the operation of MPIJIS 900 for a signal (at frequency $f_1$) entering port 1, which then exits port 1 or exits port 2, respectively. Likewise, scattering parameters $S_{22}$ and $S_{12}$ define the operation of MPIJIS 900 for a signal (at frequency $f_1$) entering port 2, which then exits port 2 or exits port 1, respectively.

II. FIG. 14 depicts device equations for the special case of nominally identical mixers operated at the same working point.

Now, turning to a special case of nominally identical mixers 302A and 302B operated at the same working point, the following relations are satisfied $r_1=r_2=r$, $|t_1|=|t'_1|=|t_2|=|t'_2|=t$ (which means that the mixers 302A and 302B are nominally identical and biased at the same working point), $|\alpha|=\alpha'$, $\varphi \equiv \varphi_1-\varphi_2$, and $|r|^2+|t|^2=1$. In this special case, the results of the [S] matrix are $$S_{a1a1} = S_{a2a2} = r\frac{1-\alpha'^2 e^{2i\varphi_d}}{1-r^2\alpha'^2 e^{2i\varphi_d}}$$

$$S_{a1a2} = -\frac{t^2\alpha' e^{i(\varphi_d-\varphi)}}{1-r^2\alpha'^2 e^{2i\varphi_d}}$$

$$S_{a2a1} = -\frac{t^2\alpha' e^{i(\varphi_d+\varphi)}}{1-r^2\alpha'^2 e^{2i\varphi_d}}$$

which results (finally) in $$S_{11} = S_{22} = -\frac{it^2\alpha' e^{i\varphi_d}}{1-r^2\alpha'^2 e^{2i\varphi_d}}\cos(\varphi)$$

$$S_{21} = \frac{i}{1-r^2\alpha'^2 e^{2i\varphi_d}}(r(1-\alpha'^2 e^{2i\varphi_d}) - t^2\alpha' e^{i\varphi_d}\sin(\varphi))$$

$$S_{12} = \frac{i}{1-r^2\alpha'^2 e^{2i\varphi_d}}(r(1-\alpha'^2 e^{2i\varphi_d}) + t^2\alpha' e^{i\varphi_d}\sin(\varphi))$$

Figure 15:
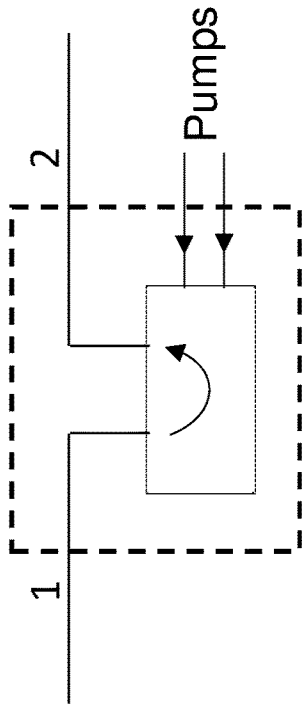
FIG. 15 depicts the device equations when the mixers are operated at the 50:50 beam splitter point.

III. FIG. 15 depicts the device equations when the mixers are operated at the 50:50 beam splitter point.

For MPIJIS 900 to operate as an isolator, mixers 302A and 302B operate at the 50:50 beam splitting working point, the following relations are satisfied $$r_1 = r_2 = r = \frac{1}{\sqrt{2}}$$

$$|t_1| = |t'_1| = |t_2| = |t'_2| = |t| = \frac{1}{\sqrt{2}}$$

$$|\alpha| = \frac{1}{\sqrt{2}}$$

Phase shifts acquired by on-resonance signals (for the idler resonators) at $f_2$ propagating along the transmission line $\varphi_d = \pi k$, where $k=0, \pm 1, \pm 2, \ldots$, For $\varphi_d=0$ and on-resonance, the scattering parameters are as follows (Equations C):

$$S_{a1a1} = S_{a2a2} = \frac{\sqrt{2}}{3}$$

$$S_{a1a2} = -\frac{\sqrt{2}}{3}e^{-i\varphi}$$

-continued $$S_{a2a1} = -\frac{\sqrt{2}}{3}e^{i\varphi}$$

Where $\varphi \equiv \varphi_1 - \varphi_2$ which then results in $$S_{11} = S_{22} = -i\frac{\sqrt{2}}{3}\cos\varphi$$

$$S_{21} = i\frac{\sqrt{2}}{3}(1-\sin\varphi)$$

$$S_{12} = i\frac{\sqrt{2}}{3}(1+\sin\varphi)$$

As seen in this figure, for $\varphi=-\pi/2$ the isolator transmits from port 1 to port 2 but blocks propagation from port 2 to port 1. Equations D show:

$$S_{11} = 0 \quad S_{22} = 0$$

$$S_{12} = 0 \quad S_{21} = i\frac{2\sqrt{2}}{3}$$

$$|S_{21}|^2 = 0.8889,$$

which in terms of decibels is $|S_{21}|(dB)=-0.51$ dB
The S matrix then is $$[S] = \begin{pmatrix} 0 & 0 \\ i\frac{2\sqrt{2}}{3} & 0 \end{pmatrix}$$

which shows transmission from port 1 to port 2 and isolation in the direction of port 2 to port 1.

IV. FIG. 16 depicts the device equations when the mixers operated at the 50:50 beam splitter point but the transmitting direction is changed.

Now suppose $\varphi$ is changed to $\pi/2$ instead of $\varphi=-\pi/2$ as in equations D. As see in this figure, for $\varphi=\pi/2$ the isolator transmits from port 2 to port 1 but blocks propagation from port 1 to port 2. Equations E show:

$$S_{11} = 0 \quad S_{22} = 0$$

$$S_{21} = 0 \quad S_{12} = i\frac{2\sqrt{2}}{3}$$

$$|S_{12}|^2 = 0.8889,$$

which in terms of decibels is $|S_{12}|(dB)=-0.51$ dB
The S matrix then is $$[S] = \begin{pmatrix} 0 & i\frac{2\sqrt{2}}{3} \\ 0 & 0 \end{pmatrix}$$

which shows transmission from port 2 to port 1 and isolation in the direction of port 1 to port 2. This type of in situ changing of isolation direction is unavailable in state-of-the-art commercial cryogenic isolators.

V. FIG. 17 depicts the device equations when the mixers operated at the 50:50 beam splitter point but the phase acquired by the internal-mode signals propagating between the two mixers is different. The working point set by the pumps' amplitude, phase difference, and frequency, is the same for the mixers but the phase acquired by the internal-mode signals at frequency f2 propagating between the two mixers is different pi versus 0. So the change is in the device design or the transmission line connecting the two mixers.

For MPIJIS 900 to operate as an isolator, mixers 302A and 302B operate at the 50:50 beam splitting working point, now at $\varphi_d = \pi$ and on-resonance and $\varphi = \pi/2$. The following relations are satisfied $$r_1 = r_2 = r = \frac{1}{\sqrt{2}}$$

$$|t_1| = |t_1'| = |t_2| = |t_2'| = |t| = \frac{1}{\sqrt{2}}$$

$$|\alpha| = \frac{1}{\sqrt{2}}$$

Now for $\varphi_d = \pi$ and on-resonance, the scattering parameters are as follows (Equations F):

$$S_{a1a1} = S_{a2a2} = \frac{\sqrt{2}}{3}$$

$$S_{a1a2} = \frac{\sqrt{2}}{3} e^{-i\varphi}$$

$$S_{a2a1} = \frac{\sqrt{2}}{3} e^{i\varphi}$$

Where $\varphi \equiv \varphi_1 - \varphi_2$ which then results in $$S_{11} = S_{22} = i\frac{\sqrt{2}}{3}\cos\varphi$$

$$S_{21} = i\frac{\sqrt{2}}{3}(1 + \sin\varphi)$$

$$S_{12} = i\frac{\sqrt{2}}{3}(1 - \sin\varphi)$$

As seen in this figure, for $\varphi = \pi/2$ the isolator transmits from port 1 to port 2 again and blocks propagation from port 2 to port 1. Equations G show:

$$S_{11} = 0 \quad S_{22} = 0$$

$$S_{12} = 0 \quad S_{21} = i\frac{2\sqrt{2}}{3}$$

$$|S_{21}|^2 = 0.8889,$$

which in terms of decibels is $|S_{21}|(dB) = -0.51$ dB

The S matrix then is $$[S] = \begin{pmatrix} 0 & 0 \\ i\frac{2\sqrt{2}}{3} & 0 \end{pmatrix}$$

which shows transmission again from port 1 to port 2 and isolation again in the direction of port 2 to port 1. From this disclosure, those of ordinary skill in the art will be able to understand that such isolation operation and the reversal of the isolation direction are possible using the proposed MPIJIS device at numerous working points by varying $\varphi_d$ (by design/layout) and $\varphi$ (by changing the phase difference between the drives) in the manner shown in FIGS. 15-17.

The circuit elements of the MPIJIS device and connections thereto can be made of superconducting material. The respective resonators and transmission/feed/pump lines can be made of superconducting materials. The hybrid couplers can be made of superconducting materials. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

As understood by one skilled in the art, there are many different technical advantages and benefits of the MPIJIS device. The MPIJIS device is substantially lossless (no greater loss than nominal losses in transmission or propagation), is easy to engineer, design, and fabricate, can be realized on chip using superconducting circuits or integrated into a PCB. The MPIJIS device can be made broadband by engineering the impedance of the JPC feedlines, and implementing lumped-element JPCs. The MPIJIS device can be made compact using lumped-element design of the hybrids and JPCs or other manifestations of nondegenerate three-wave mixers and requires no flux control or flux pulses. Additionally, because r and t do not need to be r=0 and t=1, the MPIJIS device can be very stable over a long period of time (limited mainly by the dc-flux bias of the two nondegenerate three-wave mixers) and it is easy to tune up. Also, because r and t do not need to be r=0 and t=1, the MPIJIS device can have a large dynamic range (maximum input power). The pump power feeding the device can be relatively small (less heating of the mixing chamber in a dilution refrigerator). Furthermore, other than having nominally identical nondegenerate three-wave mixers (which is within the standard fabrication capabilities), there are no stringent requirements on uniformity or homogeneity. The MPIJIS device can use one pump for all modes of operation. The MPIJIS device can be made using niobium (Nb) junctions and operated at 4K.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A microwave isolator device comprising:
    a first nondegenerate microwave mixer device (first mixer) having a first signal port and a first idler port, the first mixer configured to receive a microwave input of an input frequency via the first signal port, and further configured to generate an idler signal of an idler frequency at the first idler port;
    a second nondegenerate microwave mixer device (second mixer) having a second signal port and a second idler port, the second mixer configured to receive the microwave input of the input frequency via the second signal port, and to generate the idler signal of the idler frequency at the second idler port;
    a first input/output (I/O) port coupled to the first signal port and the second signal port;
    a second I/O port coupled to the first signal port and the second signal port; and
    a first microwave pump injecting a first microwave drive into the first mixer at a pump frequency and a first pump phase and a second microwave pump injecting a second microwave drive into the second mixer at the pump frequency and a second pump phase, wherein the pump frequency is equal to the input frequency subtracted from the idler frequency, wherein the first pump phase is adjustable relative to the second pump phase, wherein the phase adjustability is adjusted such that a microwave signal (signal) communicated between the first I/O port and the second I/O port is transmitted while propagating in a first direction between the first I/O port to the second I/O port through the first mixer and the second mixer and to be blocked while propagating in a second direction between the second I/O port to the first I/O port through the first mixer and the second mixer.

2. The microwave isolator device of claim 1,
    wherein the idler frequency of the idler signal at the first idler port is dependent upon the pump frequency and the input frequency; and
    wherein the idler frequency of the idler signal at the second idler port is dependent upon the pump frequency and the input frequency.

3. The microwave isolator device of claim 2, wherein the first microwave pump is configured to cause the first mixer to operate at a 50:50 beamsplitting working point, and wherein the second microwave pump is configured to cause the second mixer to operate at the 50:50 beamsplitting working point.

4. The microwave isolator device of claim 2, wherein changing a difference between the first pump phase and the second pump phase causes the signal to be transmitted while propagating in the second direction and blocked while propagating in the first direction.

5. The microwave isolator device of claim 1, further comprising:
    a four-port microwave hybrid device (pump hybrid); and
    a microwave pump coupled to the pump hybrid such that a first output port of the pump hybrid injects a first microwave drive into the first mixer at a pump frequency and a first pump phase and a second output port of the pump hybrid injects a second microwave drive into the second mixer at the pump frequency and a second pump phase, wherein the pump hybrid fixes a relative phase between the first microwave drive and the second microwave drive to ±90 degrees.

6. The microwave isolator device of claim 1, wherein the first idler port and the second idler port are coupled via a transmission line, the transmission line having a negligible energy loss.

7. The microwave isolator device of claim 1, wherein the first idler port and the second idler port are coupled together using a coupling component, wherein the coupling component introduces an attenuation of a signal that is propagated between the first mixer and the second mixer.

8. The microwave isolator of claim 1,
wherein the first idler port of the first mixer comprises a first feedline and a second feedline,
wherein the second idler port of the second mixer comprises a different first feedline and a different second feedline,
wherein the second feedline and the different second feedline are coupled via a transmission line, the transmission line having a negligible energy loss,
wherein the first feedline is coupled to a 50 Ohm termination, and
wherein the different first feedline is coupled to a different 50 Ohm termination.

9. The microwave isolator device of claim 1, wherein the first and second I/O ports are part of a ninety-degree hybrid coupler, and a function of the first signal port and the second signal port are configured to be equivalent in the first mixer and the second mixer.

10. The microwave isolator device of claim 1, wherein the first mixer and the second mixer are each a nondegenerate three-wave mixer.

11. The microwave isolator device of claim 1, wherein the first mixer and the second mixer are each a Josephson parametric converter (JPC), and wherein the first mixer and the second mixer are nominally identical.

12. A method to form a microwave isolator device, the method comprising:
configuring a first nondegenerate microwave mixer device (first mixer) having a first signal port and a first idler port, the first mixer configured to receive a microwave input of an input frequency via the first signal port, and further configured to generate an idler signal of an idler frequency at the first idler port;
configuring a second nondegenerate microwave mixer device (second mixer) having a second signal port and a second idler port, the second mixer configured to receive the microwave input of the input frequency via the second signal port, and to generate the idler signal of the idler frequency at the second idler port;
coupling a first input/output (I/O) port to the first signal port and the second signal port;
coupling a second I/O port to the first signal port and the second signal port;
injecting, from a first microwave pump, a first microwave drive into the first mixer at a pump frequency and a first pump phase; and
injecting, from a second microwave pump, a second microwave drive into the second mixer at the pump frequency and a second pump phase, wherein the pump frequency is equal to the input frequency subtracted from the idler frequency, wherein the first pump phase is adjustable relative to the second pump phase, wherein the phase adjustability is adjusted such that a microwave signal (signal) communicated between the first I/O port and the second I/O port is transmitted while propagating in a first direction between the first I/O port to the second I/O port through the first mixer and the second mixer and to be blocked while propagating in a second direction between the second I/O port to the first I/O port through the first mixer and the second mixer.

13. The method of claim 12,
wherein the idler frequency of the idler signal at the second port is dependent upon the pump frequency and the input frequency; and
wherein the idler frequency of the idler signal at the second port is dependent upon the pump frequency and the input frequency.

14. The method of claim 13, wherein the first microwave pump is configured to cause the first mixer to operate at a 50:50 beamsplitting working point, and wherein the second microwave pump is configured to cause the second mixer to operate at the 50:50 beamsplitting working point.

15. The method of claim 13, wherein changing a difference between the first pump phase and the second pump phase causes the signal to be transmitted while propagating in the second direction and blocked while propagating in the first direction.

16. The method of claim 12, further comprising:
coupling a four-port microwave hybrid device (pump hybrid) to a microwave pump such that a first output port of the pump hybrid injects a first microwave drive into the first mixer at a pump frequency and a first pump phase and a second output port of the pump hybrid injects a second microwave drive into the second mixer at the pump frequency and a second pump phase, wherein the pump hybrid fixes a relative phase between the first microwave drive and the second microwave drive to ±90 degrees.

17. The method of claim 12, wherein the first idler port and the second idler port are coupled via a transmission line, the transmission line having a negligible energy loss.

18. The method of claim 12, wherein the first idler port and the second idler port are coupled together using a coupling component, wherein the coupling component introduces an attenuation of a signal that is propagated between the first mixer and the second mixer.

19. The method of claim 12,
wherein the first idler port of the first mixer comprises a first feedline and a second feedline,
wherein the second idler port of the second mixer comprises a different first feedline and a different second feedline,
wherein the second feedline and the different second feedline are coupled via a transmission line, the transmission line having a negligible energy loss,
wherein the first feedline is coupled to a 50 Ohm termination, and
wherein the different first feedline is coupled to a different 50 Ohm termination.

20. The method of claim 12, wherein the first and second I/O ports are part of a ninety-degree hybrid coupler, and a function of the first signal port and the second signal port are configured to be equivalent in the first mixer and the second mixer.

21. The method of claim 12, wherein the first mixer and the second mixer are each a nondegenerate three-wave mixer.

22. The method of claim 12, wherein the first mixer and the second mixer are each a Josephson parametric converter (JPC), and wherein the first mixer and the second mixer are nominally identical.

23. A superconductor fabrication system which when operated to fabricate a microwave isolator device performing operations comprising:

configuring a first nondegenerate microwave mixer device (first mixer) having a first signal port and a first idler port, the first mixer configured to receive a microwave input of an input frequency via the first signal port, and further configured to generate an idler signal of an idler frequency at the first idler port;

configuring a second nondegenerate microwave mixer device (second mixer) having a second signal port and a second idler port, the second mixer configured to receive the microwave input of the input frequency via the second signal port, and to generate the idler signal of the idler frequency at the second idler port;

coupling a first input/output (I/O) port to the first signal port and the second signal port;

coupling a second I/O port to the first signal port and the second signal port;

injecting, from a first microwave pump, a first microwave drive into the first mixer at a pump frequency and a first pump phase; and injecting, from a second microwave pump, a second microwave drive into the second mixer at the pump frequency and a second pump phase, wherein the pump frequency is equal to the input frequency subtracted from the idler frequency, wherein the first pump phase is adjustable relative to the second pump phase, wherein the phase adjustability is adjusted such that a microwave signal (signal) communicated between the first I/O port and the second I/O port is transmitted while propagating in a first direction between the first I/O port to the second I/O port through the first mixer and the second mixer and to be blocked while propagating in a second direction between the second I/O port to the first I/O port through the first mixer and the second mixer.

24. The superconductor fabrication system of claim 23, wherein the idler frequency of the idler signal at the second port is dependent upon the pump frequency and the input frequency; and wherein the idler frequency of the idler signal at the second port is dependent upon the pump frequency and the input frequency.

25. The superconductor fabrication system of claim 24, wherein the first microwave pump is configured to cause the first mixer to operate at a 50:50 beamsplitting working point, and wherein the second microwave pump is configured to cause the second mixer to operate at the 50:50 beamsplitting working point.

* * * * *